US011131689B2

(12) United States Patent
Audette et al.

(10) Patent No.: US 11,131,689 B2
(45) Date of Patent: Sep. 28, 2021

(54) LOW-FORCE WAFER TEST PROBES

(71) Applicant: International Business Machines Corporation, Armonk, NY (US)

(72) Inventors: David M. Audette, Colchester, VT (US); S J. Chey, Mount Kisco, NY (US); Doreen D. DiMilia, Pleasantville, NY (US); Sankeerth Rajalingam, Peekskill, NY (US); Grant Wagner, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 15/604,750

(22) Filed: May 25, 2017

(65) Prior Publication Data
US 2018/0340958 A1 Nov. 29, 2018

(51) Int. Cl.
*G01R 1/067* (2006.01)
*H01L 21/66* (2006.01)
*G01R 1/04* (2006.01)

(52) U.S. Cl.
CPC ....... *G01R 1/06733* (2013.01); *G01R 1/0491* (2013.01); *H01L 22/30* (2013.01)

(58) Field of Classification Search
CPC ............ G01R 1/07307; G01R 1/07342; G01R 1/06711; G01R 1/06727; G01R 1/06733;
(Continued)

(56) References Cited

U.S. PATENT DOCUMENTS 5,929,521 A * 7/1999 Wark ................. G01R 1/06738
257/692
6,037,786 A * 3/2000 Palagonia ............ G01R 1/0466
324/754.18
(Continued)

FOREIGN PATENT DOCUMENTS

EP 1659410 A2 5/2006

OTHER PUBLICATIONS

IBM Appendix P, "List of IBM Patents or Patent Applications to be Treated as Related", Dated Apr. 2, 2019, 2 pages.
(Continued)

*Primary Examiner* — Tung X Nguyen
*Assistant Examiner* — Robert P Alejnikov, Jr.
(74) *Attorney, Agent, or Firm* — William E. Schiesser

(57) ABSTRACT

Embodiments herein describe structures of low-force wafer test probes and formation thereof. Structures of low-force wafer test probes and their formation via gray scale etch or electroplating is described. Structures are described that include a lower base structure on top of a substrate and an upper blade structure on top of the lower base structure. In various embodiments, a crown of a C4 bump is accommodated by one or both of: i) a cavity present in the lower base structure; and ii) a height of the upper blade structure. Processes for fabricating probe structures are described that include forming lower base structures upon a substrate and forming upper blade structures on top of the lower base structures. The upper blade structures include at least one blade. Each of the blade(s) include a cutting edge that points toward a center point within the probe structure.

9 Claims, 24 Drawing Sheets

(58) Field of Classification Search
CPC ...... G01R 3/00; G01R 31/2808; G01R 31/28; G01R 31/2851; G01R 31/318505; G01R 31/318511; G01R 31/318513; G01R 1/0408; G01R 1/0491; G01R 1/06; G01R 1/067; H01L 2924/15311; H01L 23/49816; H01L 24/10; H01L 2224/13023; H05K 2201/10734
USPC .............................. 324/754.2, 754.03, 754.01
See application file for complete search history.

(56) References Cited

U.S. PATENT DOCUMENTS

| | | | |
|---|---|---|---|
| 6,156,484 | A | 12/2000 | Bassous et al. |
| 6,214,716 | B1 | 4/2001 | Akram |
| 6,599,776 | B2 | 7/2003 | Akram et al. |
| 7,161,250 | B2 | 1/2007 | Wark et al. |
| 7,205,661 | B2 | 4/2007 | Wark et al. |
| 7,688,089 | B2 * | 3/2010 | Audette ............... G01R 1/0735 324/754.18 |
| 8,001,685 | B2 | 8/2011 | Jo |
| 8,460,981 | B2 | 6/2013 | Ellis-Monaghan et al. |
| 8,933,717 | B2 | 1/2015 | Audette et al. |
| 9,472,490 | B1 | 10/2016 | Sullivan et al. |
| 2007/0075726 | A1 * | 4/2007 | Chan ................. G01R 1/06711 324/754.18 |
| 2010/0264541 | A1 | 10/2010 | Lee |
| 2011/0266539 | A1 * | 11/2011 | Chey ................. G01R 1/06716 257/48 |
| 2013/0200434 | A1 | 8/2013 | Ellis-Monaghan et al. |
| 2013/0210227 | A1 | 8/2013 | Ellis-Monaghan et al. |
| 2013/0342234 | A1 | 12/2013 | Audette et al. |

OTHER PUBLICATIONS

Audette et al., "Processes for Fabricating Low-Force Wafer Test Probes and Their Structures", U.S. Appl. No. 16/372,527, filed Apr. 2, 2019, pp. 1-33.

IBM Appendix P, "List of IBM Patents or Patent Applications to be Treated as Related", Dated Feb. 6, 2018, 2 pages.

Audette et al., "Processes for Fabricating Low-Force Wafer Test Probes and Their Structures", U.S. Appl. No. 15/889,531, filed Feb. 6, 2018, pp. 1-36.

* cited by examiner

LOW-FORCE WAFER TEST PROBES

BACKGROUND

The present invention generally relates to testing wafers upon which electronic circuits are formed, and more particularly, to processes for fabricating test probes with blades that cut through the oxide layer of controlled collapse chip connect (C4) bumps using minimal force.

An important facet of the semiconductor industry resides in being able to provide satisfactorily functioning semiconductor devices. In particular, such semiconductor devices may comprise wafers which are divided into areas which form chips, the shapes and dimensions of which are as close to identical as possible, so as to impart consistent uniform electrical properties thereto.

Generally, semiconductor devices on chips are often connected to each other with thin strips of metal, referred to in the art as interconnection metallurgy, which in turn contact the wafer surface through a series of pads or bumps. Other connector pad configurations include an array of electrical contacts or bumps which are distributed over an area such as the widely employed C4 bumps (controlled collapse chip connects). Such bumps or electrical contacts extend above the integrated circuits and have a generally spherical or round cross-sectional configuration.

SUMMARY

Embodiments herein describe structures of low-force wafer test probes and formation thereof. In some embodiments, structures of low-force wafer test probes and their formation via a gray scale etch is described. In some embodiments, a structure is described using electroplating that includes a lower base structure on top of a substrate and an upper blade structure on top of the lower base structure. A crown of a C4 bump is accommodated by one or both of: i) a cavity present in the lower base structure; and ii) a height of the upper blade structure. In some embodiments, a process for fabricating a probe structure on a substrate is described. The process includes forming a lower base structure upon a substrate and forming an upper blade structure on top of the lower base structure. The upper blade structure includes at least one blade. Each of the at least one blade includes a cutting edge that points toward a center point within the probe structure.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

Figure 1A:
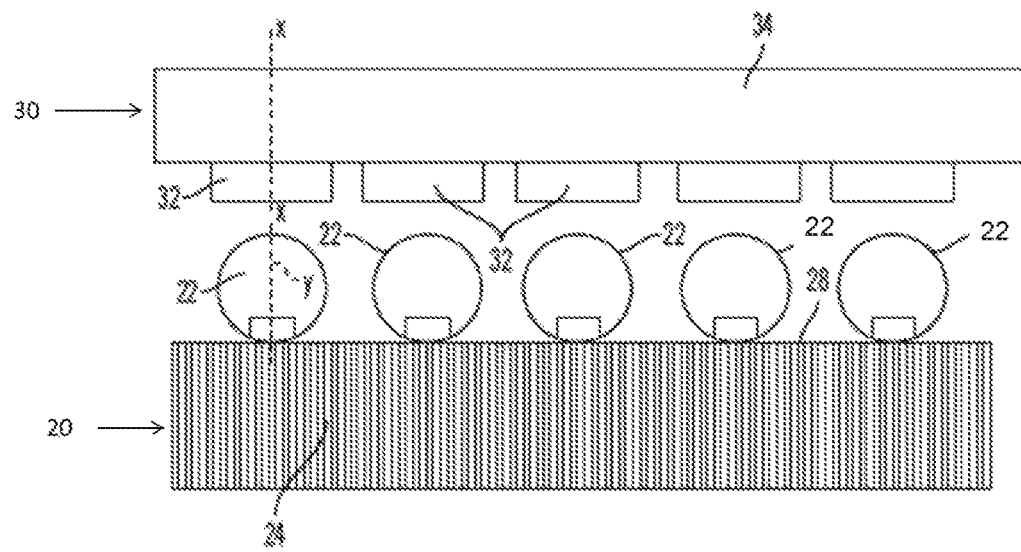
FIGS. 1A and 1B illustrate respectively: i) a plurality of probes in alignment with a plurality of C4 bumps prior to coming into contact with the plurality of C4 bumps; and ii) the plurality of probes in actual contact with the plurality of C4 bumps, in accordance with an exemplary embodiment of the present invention.

The drawings are not necessarily to scale. The drawings are merely schematic representations, not intended to portray specific parameters of the invention. The drawings are intended to depict only typical embodiments of the invention.

DETAILED DESCRIPTION

I. Introduction

Although wafers are formed as uniformly as possible through current manufacturing techniques, it is not always feasible that every chip produced is perfect. In order to identify defective chips, electrical tests are performed to facilitate the sorting out of good chips and eliminating defective chips prior to the next step of manufacture.

Ordinarily, active testing of the wafers is performed by a test facility in which the pads or areas on wafers possessing arrays of bumps, such as of C4 bumps, are contacted by an assembly incorporating test probes. In order to successfully probe the integrity of the pads or bumps, it is desirable that an oxide layer, which inevitably forms on the surface of the C4 bumps, be ruptured and penetrated to ensure good electrical contact with the probe while employing only a minimal force to inhibit damaging the pads or bumps.

A substrate having a plurality of probes mounted thereto is used to perform a test on the plurality of C4 humps of a wafer simultaneously. Each probe technology has a characteristic system compliance or spring rate, thus the correct probe force occurs at a specific probe displacement relative to the wafer. Consequently, current wafer testing practice is to displace the wafer the specified distance into the probe system. Unfortunately, the resulting forces may result in significant deflection of the probe support structure. This may be especially problematic for rigid probe arrays that incorporate a large number of probes because overdrive must be increased to overcome deflection of the support structure. As a result, the contact area, and therefore the contact force, applied by the probes to each of the plurality of C4 bumps may vary across the array.

Citation of an "embodiment" or a similar expression in the specification means that specific features, structures, or characteristics described in the embodiments are included in at least one embodiment of the present invention. Hence, the wording "in an embodiment" or a similar expression in this specification does not necessarily refer to the same specific embodiment as other embodiments.

Embodiments of the present invention are, at times, combinable. Thus, it should be understood that when two or more embodiments are claimed in a particular combination, that particular combination is feasible as readily understood by a person having ordinary skill in the art and, hence, included in the present Detailed Description even though that combination was not explicitly described.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments. It should be understood that the present invention could be modified by those skilled in the art in accordance with the following description to achieve the results of the present invention. Therefore, the following description shall be considered as an explanatory disclosure related to the present invention for those skilled in the art, not intended to limit the claims of the present invention.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As used herein, terms such as "depositing", "forming", and the like refer to the disposition of layers or portions of materials in the present embodiments. Such processes may not be different than in the standard practice of the art of wafer test probe fabrication.

The present invention will now be described in detail with reference to the Figures.

Referring now to FIG. 1A, an example of an array 30 of test probes 32 used to test the electrical conductivity of an electrical semiconductor wafer 20 is illustrated. The semiconductor wafer 20 includes a plurality of conductive bumps 22, also referred to as controlled collapse chip connects ("C4 bumps"), which have a generally spherical or curved top shape. In various embodiments, the semiconductor wafer 20 includes a base layer 24 formed from a substrate, such as an organic or ceramic material for example, having a specific structure or openings. In one embodiment, the base layer 24 includes a single layer of material. In other embodiments, the base layer 24 includes multiple layers of material. In one embodiment, the wafer 20 as supported in a test fixture has the capability of moving in one or more directions prior to electrical contact for indexing the position of the wafer 20 and the circuit on the wafer 20 to be tested. In other embodiments, the wafer 20 as supported in a test fixture does not have the capability of moving in one or more directions prior to electrical contact for indexing the position of the wafer 20 and the circuit on the wafer 20 to be tested.

Figure 1B:
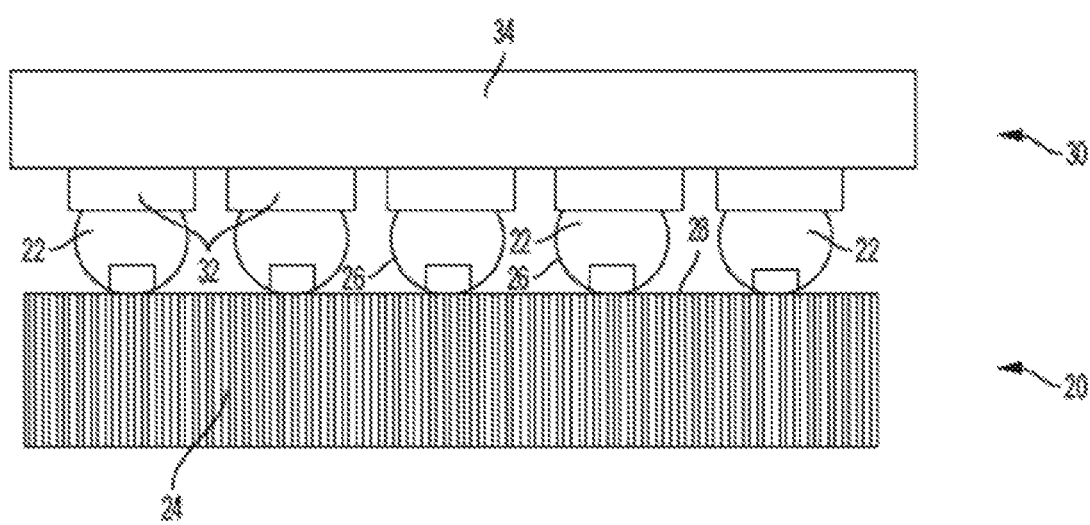

As shown, the probes 32 of the array 30 are mounted to a structure 34 in a configuration such that each probe 32 is substantially aligned with one of the C4 bumps 22 on a semiconductor wafer 20. Each of the probes 32 has a longitudinal axis X which passes through the center of the probe 32 such that a height of each probe 32 may be measured along the longitudinal axis. When the probe 32 is in contact with C4 bumps 22, as shown in FIG. 1B, the distance between the structure 34 and the C4 bumps 22 is less than the length of the probes 32, to ensure that a pressure or force is applied to each of the C4 bumps 22. The pressure or force provides penetration of the C4 bumps 22 resulting in piercing and exposing a new clean contact surface free of oxide below the former surface 26 of the C4 bump 22.

II. Gray Scale Etch Processes for Forming Probes

Figure 2:
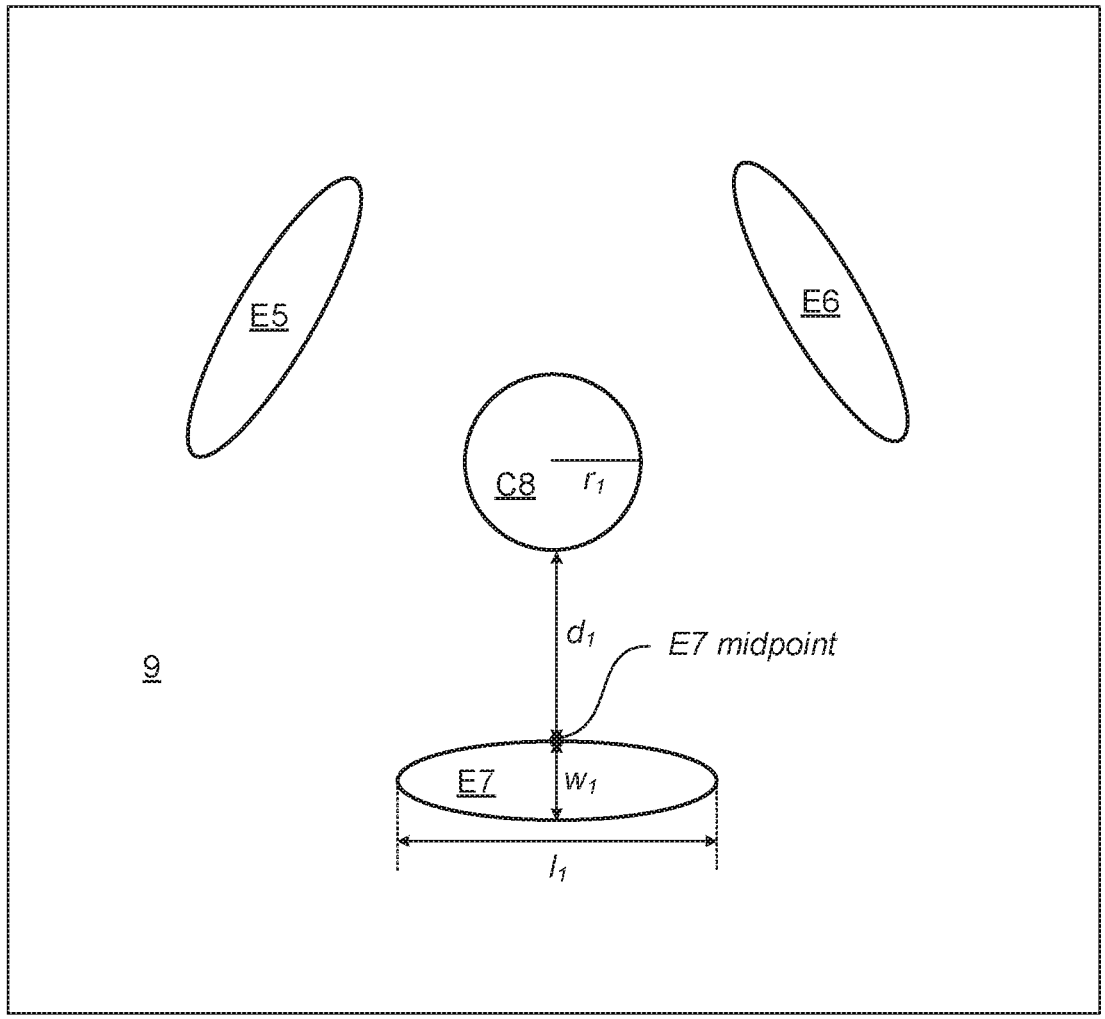
FIG. 2 illustrates a first etched pattern on top of a photoresist layer to expose underlying conductive material in the form of etched elliptical openings and a circular opening, in accordance with an exemplary embodiment of the present invention.

FIG. 2 illustrates a top-down view of an etched pattern on top of a photoresist layer 9 to expose underlying conductive material in the form of etched elliptical openings E5, E6, and E7 and circular opening C8. In various embodiments, the conductive material exposed by etched elliptical openings E5, E6, E7, and circular opening C8 is any conductive material that can be wet-etched. Examples of such conductive material include one or more of: copper, molybdenum, aluminum, etc. Photoresist 9 is any photoresist that allows an etched resolution for the openings as described infra. In one embodiment, the photoresist used is AZ1518. In the example depicted by FIG. 2, etched elliptical openings E5, E6, and E7 symmetrically surround etched circular opening C8. In this example, the symmetry of ellipses E5, E6, and E7 surrounding circular opening C8 is $C_3$. Other embodiments of the present invention are not limited to a $C_3$ symmetry. In other words, other embodiments of the present invention include more than three ellipses or less than three ellipses symmetrically surrounding a circular opening such as circular opening C8.

In the example depicted by FIG. 2, etched elliptical openings E5 and E6 all share substantially similar geometric dimensions as elliptical opening E7. The dimensions described for FIG. 2 infra are dimensions that, after undergoing gray scale etching, will produce a probe opening that accommodates a C4 bump with an approximately 100 μm diameter. As depicted in FIG. 2, the closest borders of elliptical opening E7 (like the closest borders of elliptical openings E5 and E6) include a width $w_1$ of approximately 6 μm between those borders in order to produce a probe that accommodates a C4 bump with a diameter of approximately 100 μm. The accommodation of smaller or larger diameter C4 bumps will require a width $w_1$ that is, respectively, smaller or larger. As depicted in FIG. 2, the widest borders of elliptical opening E7 include a length $l_1$ of approximately 27 μm (which is substantially similar to the corresponding widest borders of elliptical openings E5 and E6) in order to produce a probe that accommodates a C4 bump with a diameter of approximately 100 μm. The accommodation of smaller or larger diameter C4 bumps will require a length $l_1$ that is, respectively, smaller or larger. As depicted in FIG. 2, a midpoint of one of the long-side borders of elliptical openings E5, E6, and E7 are closest to the border of circular opening C8. As depicted in FIG. 2, the distance between the midpoint of the closest long-side border of E7 (i.e., E7 midpoint) is approximately 15 μm from the nearest border of circular opening C8. Analogously, the midpoints of the closest long-side borders of E5 and E6 are of a substantially similar distance from the closest borders of C8 relative to E5 and E6.

In the example depicted by FIG. 2, circular opening C8, the border of which is substantially equidistant from the midpoint of the closest long-side borders of elliptical openings E5, E6, and E7 (i.e., 15 μm in the example depicted in FIG. 2). Circular opening C8 includes a radius $r_1$ that is approximately 7.5 μm.

Figure 3:
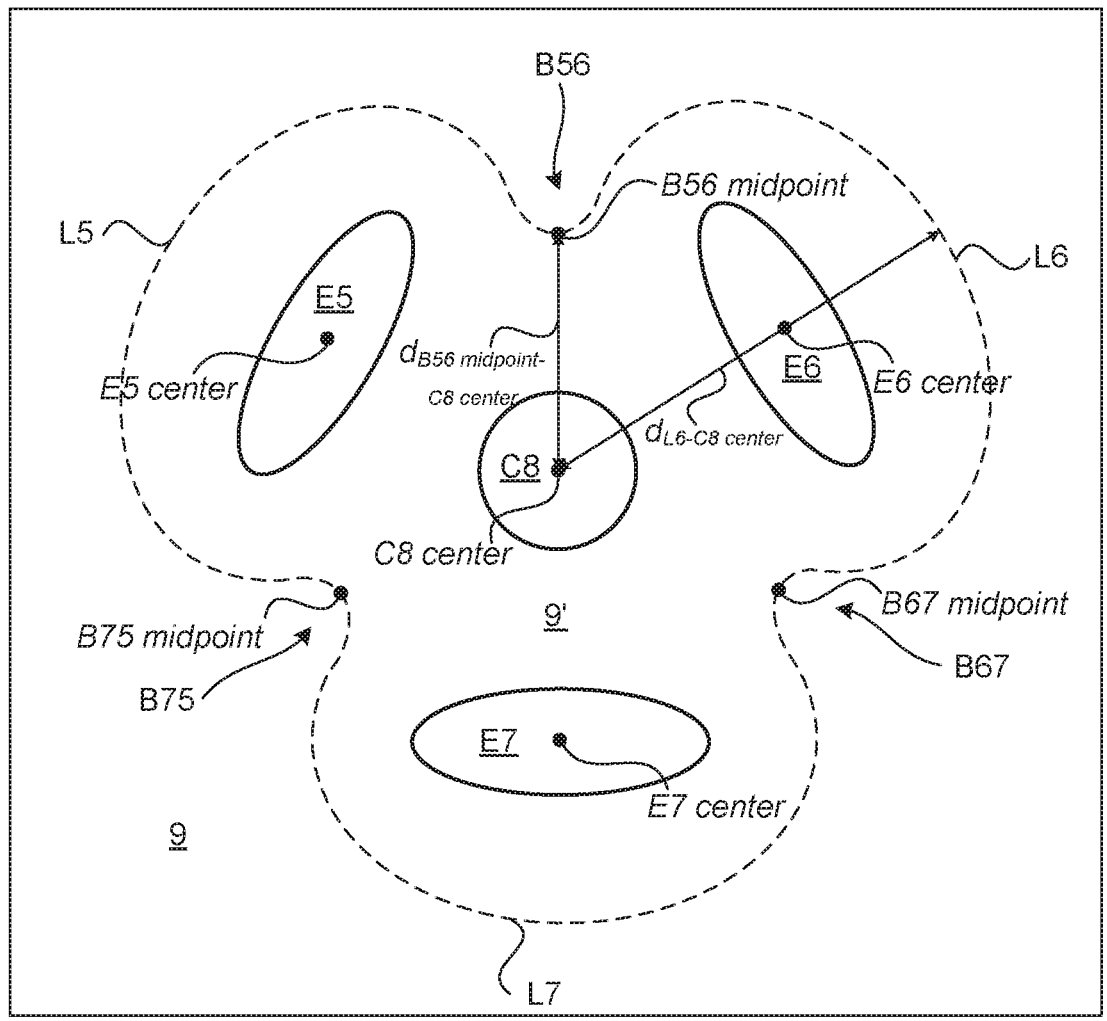
FIG. 3 illustrates a gray scale etch of the structure shown in FIG. 2, in accordance with an exemplary embodiment of the present invention.

FIG. 3 illustrates a gray scale etch of the structure shown in FIG. 2. In general, "gray scale etch" refers to the fabrication of sculpted test probes that includes exposure and development of a pattern in a photoresist layer overlying the conducting material of a conducting material-clad flexible insulating material. The conducting material is etched in a solution that removes the conducting material by permeating through patterned openings in the photoresist layer at varying rates that depend on the pattern of exposure and the development of the resist. Smaller/narrower openings in the pattern etch more slowly than larger/wider openings, leaving in the conducting material layer a gray scale pattern comprising the probes, probe pads, and conducting material-free areas. The layout of the mask that is used to expose the resist and ultimately produce the gray scale pattern in the conducting material layer is designed to accommodate the relationship between sizes/shapes of openings and etch rates. Typical conditions used to produce the example structures depicted in FIGS. 3 and 5 from, respectively, the structures depicted in FIGS. 2 and 4 include the use of CE100 etchant (purchased from TRANSENE COMPANY, INC.) applied using a wet-etch at approximately 27° C. for approximately 8 minutes. Other etchants and conditions may also produce similar results.

As depicted in FIG. 3, the gray scale etch of the structure shown in FIG. 2 creates cavity 9', which is the result of etchant diffusion through openings E5-7 and C8. Material is removed immediately beneath openings E5-7 and C8 as well as laterally between openings E5-7 and C8 to create cavity 9' beneath photoresist 9. Cavity 9' includes the areas encompassed by openings E5-7 and C8, which are not covered by (i.e., beneath) photoresist layer 9. In this example, cavity 9' features lobes L5, L6, and L7 and blades B56, B67, and B75. The border of cavity 9' marks the beginning of a downward slope to create a bowl-like opening that accommodates a C4 bump to be tested. Blades B56, B67, and B75 are designed to cut through areas of the C4 bump that come in contact with said blades in order to expose the non-oxidized C4 bump conductive material beneath an oxidized layer on the C4 bump.

In the example depicted in FIG. 3, the distance (i.e., $d_{B56\ midpoint\text{-}C8center}$) between the center of circular opening C8 (i.e. C8 center) and the midpoint of blade B56 (i.e., B56 midpoint) is approximately 34 µm. The distances between the center of circular opening C8 and the midpoints of blades B67 and B75 (i.e., B67 midpoint and B75 midpoint, respectively) are substantially similar to $d_{B56\ midpoint\text{-}C8center}$. The distance (i.e., $d_{L6\text{-}C8\ center}$) between the center of circular opening C8 and the furthest border of lobe L6, which is a line passing through the center of elliptical opening E6 (i.e., E6 center), is approximately 52 µm in order to accommodate a C4 bump with a diameter of approximately 100 µm. The distances between the center of circular opening C8 and the furthest borders of lobes of L5 and L7 (measured along lines (not shown) passing through E5 center and E7 center, respectively) are substantially similar to $d_{L6\text{-}C8\ center}$.

Figure 4:
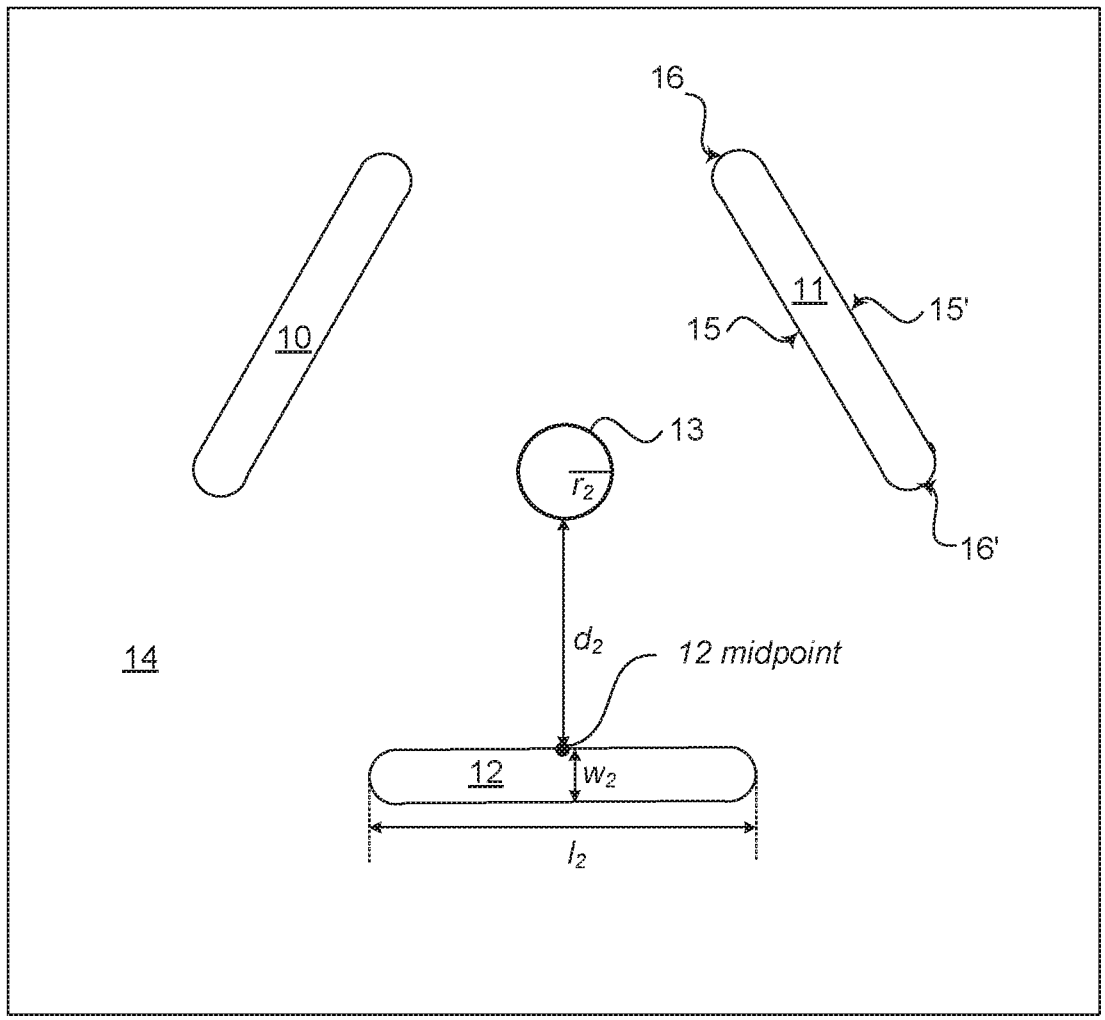
FIG. 4 illustrates a second etched pattern on top of a photoresist layer to expose underlying conductive material in the form of etched bracket openings and a circular opening, in accordance with an exemplary embodiment of the present invention.

FIG. 4 illustrates a top-down view of an etched pattern on top of a photoresist layer 14 to expose underlying conductive material in the form of etched bracket openings 10, 11, and 12 and circular opening 13. In various embodiments, the conductive material exposed by etched elliptical openings 10, 11, 12, and circular opening 13 is any conductive material that can be wet-etched. Examples of such conductive material include one or more of: copper, molybdenum, aluminum, etc. Like photoresist 9, photoresist layer 14 is any photoresist that allows an etched resolution for the openings as described herein. In one embodiment, the photoresist used is AZ1518. In the example depicted in FIG. 4, etched bracket openings 10, 11, and 12 symmetrically surround etched circular opening 13. In this example, the symmetry of etched brackets 10, 11, and 12 surrounding circular opening 13 is $C_3$. Other embodiments of the present invention are not limited to a $C_3$ symmetry. In other words, other embodiments of the present invention include more than three etched brackets or less than three etched brackets symmetrically surrounding a circular opening such as circular opening 13.

In the example depicted by FIG. 4, etched bracket openings 10 and 11 both share substantially similar geometric dimensions as etched bracket opening 12. As depicted in FIG. 4, the closest internal borders of etched bracket opening 12 (like the closest internal borders of etched bracket openings 10 and 11) include a width $w_2$ of approximately 5 µm between those borders. As depicted in FIG. 4, the widest internal borders of etched bracket opening 12 include a length $l_2$ of approximately 32 µm (which is substantially similar to the corresponding widest internal borders of etched bracket openings 10 and 11). As depicted in FIG. 4, etched bracket openings 10, 11, and 12 include two long, substantially straight borders (15 and 15' shown for etched bracket opening 11) and two curved ends (16 and 16' shown for etched bracket opening 11). As depicted in FIG. 4, a midpoint (i.e., 12 midpoint) for one of the long, substantially straight borders of etched bracket opening 12 is closest to the nearest border of circular opening 13. As depicted in FIG. 4, the distance $d_2$ between the midpoint of the closest long, substantially straight border of etched bracket opening 12 (i.e., 12 midpoint) is approximately 20 µm from the nearest border of circular opening 13. Analogously, the midpoints (not shown) of the closest long, substantially straight borders of etched bracket openings 10 and 11 are of a substantially similar distance (i.e., $d_2$) from the corresponding closest borders of circular opening 13.

Figure 5:
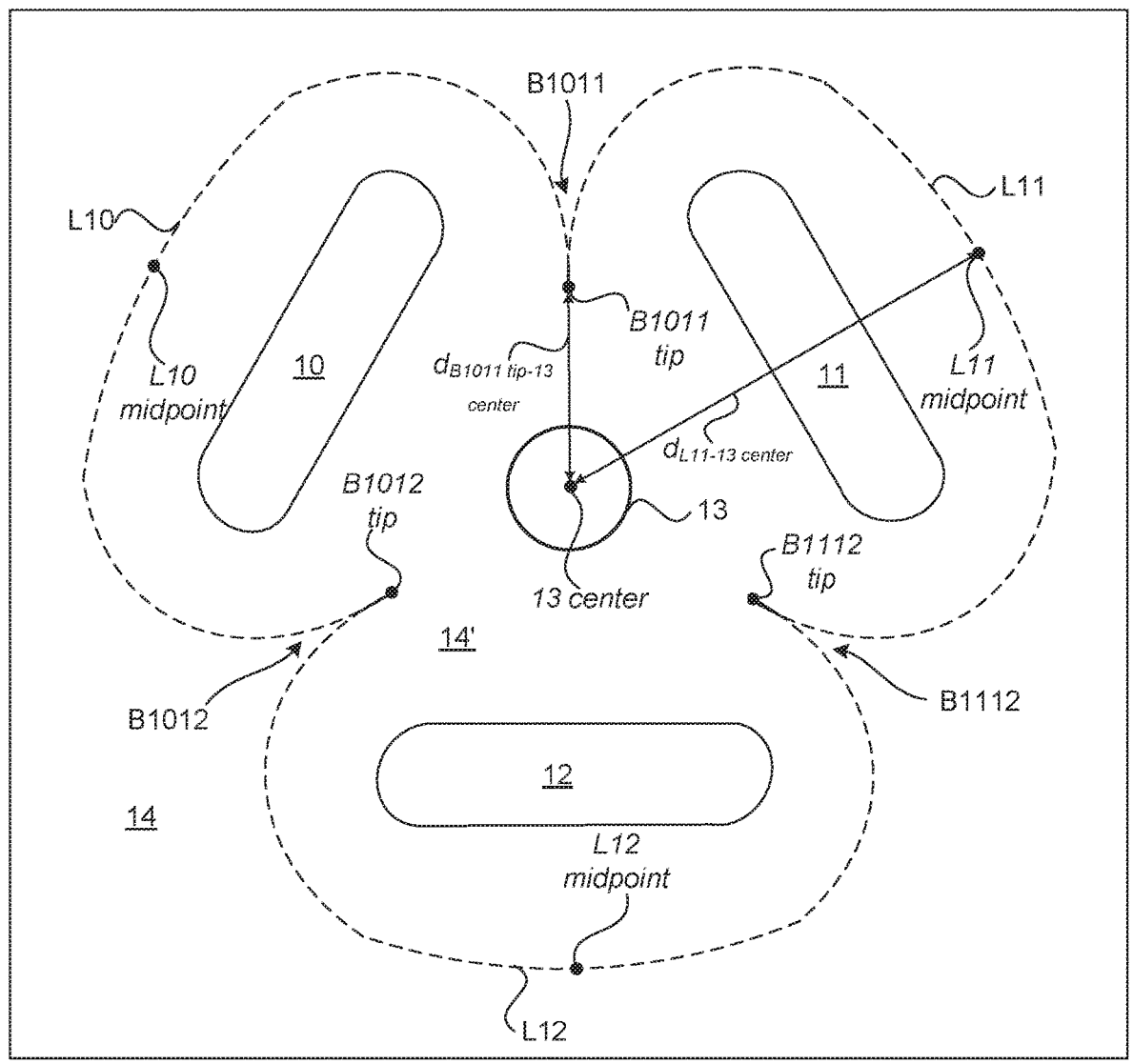
FIG. 5 illustrates a gray scale etch of the structure shown in FIG. 4, in accordance with an exemplary embodiment of the present invention.

As depicted in FIG. 5, a gray scale etch of the structure shown in FIG. 4 creates cavity 14', which is the result of etchant diffusion through openings 10-13. Material is removed immediately beneath openings 10-13 as well as laterally between openings 10-13 to create cavity 14' beneath photoresist 14. Cavity 14' includes the areas encompassed by openings 10-13 as well. In this example, cavity 14' features lobes L10, L11, and L12 and indentations in cavity 14' between lobes L10, L11, and L12 that serve as blades (i.e., B1011, B1112, and B1012). The border of cavity 14' marks the beginning of a downward slope to create a bowl-like opening that accommodates a C4 bump to be tested. Blades B1011, B1112, and B1012 are designed to cut through areas of the C4 bump that come in contact with said blades in order to expose the non-oxidized C4 bump conductive material beneath an outer oxidized layer on the C4 bump.

In the example depicted in FIG. 5, the distance (i.e., $d_{B1011\ tip\text{-}13\ center}$) between the center of circular opening 13 (i.e. 13 center) and the tip of blade B1011 (i.e., B1011 tip) is approximately 34 µm. The distances between the center of circular opening 13 and the tips of blades B1112 and B1012 (i.e., B1112 tip and B1012 tip, respectively) are substantially similar to $d_{B1011\ tip\text{-}13\ center}$. The distance (i.e., $d_{L11\text{-}13\ center}$) between the center of circular opening 13 and the furthest border of lobe L11, which is a line (shown) between 13 center and L11 midpoint is approximately 52 µm. The distances between the center of circular opening 13 and the furthest borders of lobes of L10 and L12 (measured along lines (not shown) passing between 13 center and, respectively, L10 midpoint and L12 midpoint) are substantially similar to $d_{L11\text{-}13\ center}$.

One noticeable difference between cavities 9' (FIG. 3) and 14' (FIG. 5) is the sharpness of the created blades. Blades B1011, B1112, and B1012 (FIG. 5) are noticeably sharper than blades B56, B67, and B75 (FIG. 3). In other words (and as is illustrated in FIGS. 3 and 5), blades B1011, B1112, and B1012 culminate in a pointed tip, i.e., B1011 tip, B1112 tip, and B1012 tip (FIG. 5) whereas blades B56, B67, and B75 culminate in a curve, the center of which are B56 midpoint, B67 midpoint, and B75 midpoint (FIG. 3). The sharper the blades, the lower the force required to cut through an oxide layer in a C4 bulb to reach conductive material beneath the oxide layer. Hence, cavity 14' requires less force to successfully test a C4 bulb than cavity 9'.

Optimization of the dimensions of probe cavities such as cavities 9' and 14' often leverage modeling. Factors that govern the creation of such probe cavities via a gray scale etch include one or more of: i) the shape of the beginning etched openings; ii) the dimensions of the beginning etched openings; iii) the proximity of the beginning etched openings to each other; and iv) the conditions employed during the gray scale etch such as etchant type, time-of-etch, temperature, pressure, and other factors such as the method employed (i.e. agitation, ultrasonication, electro-etching etc.).

Figure 6:
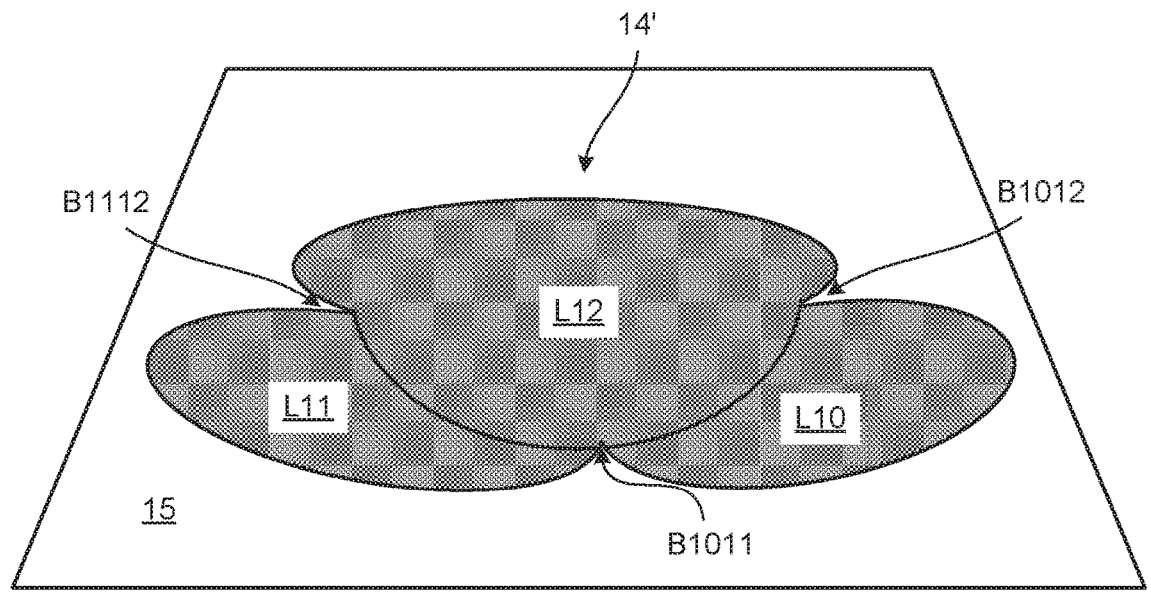
FIGS. 6 and 7 illustrate respectively: i) the structure obtained after photoresist layer removal of the structure shown in FIG. 5 and from a three-dimension 21° angle; and ii) the structure obtained after photoresist layer removal of the structure shown in FIG. 5 and from a three-dimension 45° angle, in accordance with an exemplary embodiment of the present invention.

FIG. 6 depicts a view of cavity 14' from above and at a 21° angle after photoresist 14 has been removed to expose cavity 14' and surface 15. In various embodiments, both surface 15 and cavity 14' are the same conductive material as exposed in etched bracket openings 10, 11, 12 and circular opening 13 (FIG. 4). As depicted in FIG. 6 and described in FIG. 5, cavity 14' includes lobes L10, L11, and L12, which are formed, in part, by the downward and lateral diffusion of etchant through openings 10, 11, and 12 during a gray scale etch.

Figure 7:
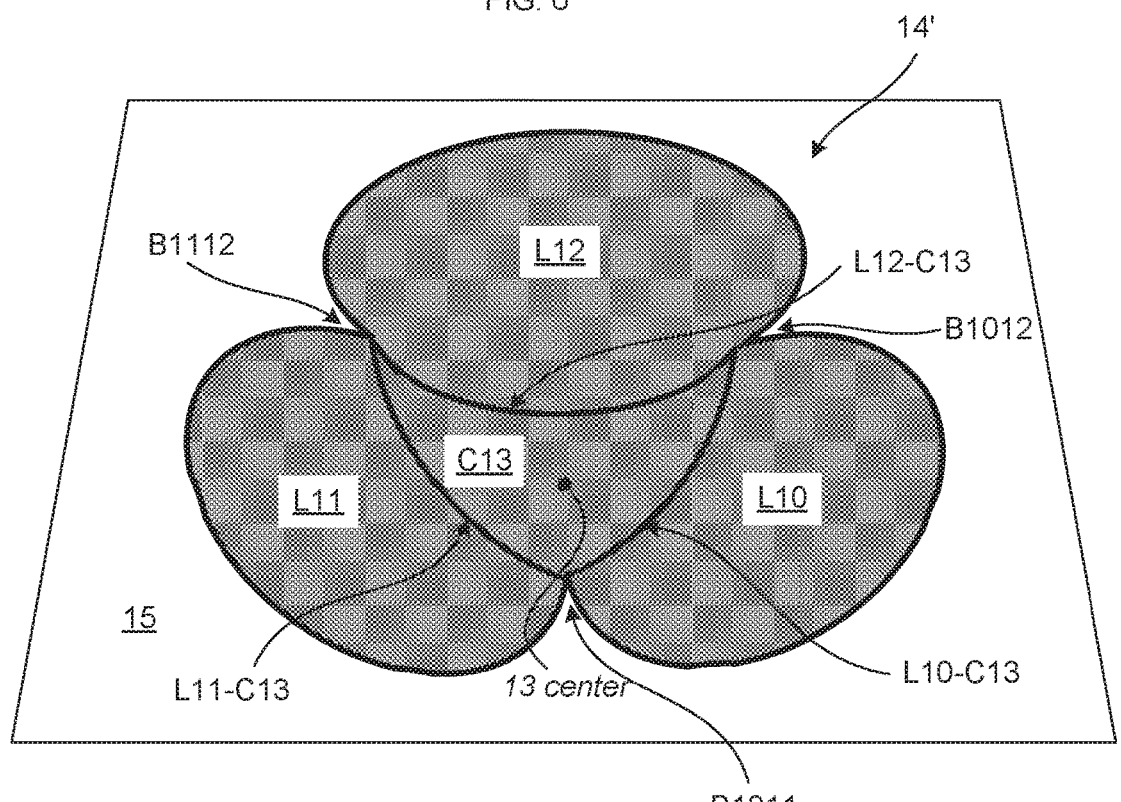

FIG. 7 depicts a view of cavity 14' from above and at a 45° angle after photoresist 14 has been removed to expose cavity 14' and surface 15. At this angle, four cavity features (L10, L11, L12, and C13) are observed. Cavity center C13 is the result, in part, of etchant diffusing downward and laterally through circular opening 13 (FIGS. 4 and 5). From this angle, borders L10-C13, L11-C13, and L12-C13 are visually apparent. These borders mark where the etchant used in the gray scale etch laterally merged between openings 10, 11, 12, and 13 during the etching process. Cavity center C13 has a lowest depth at 13 center, which is 22 µm beneath surface 15. In exemplary embodiments, the 13 center depth is deep enough to accommodate a C4 bump so that blades B1011, B1112, and B1012 are able to cut through the outer oxide layer of the C4 bump in order to test the C4 bump.

Figure 8A:
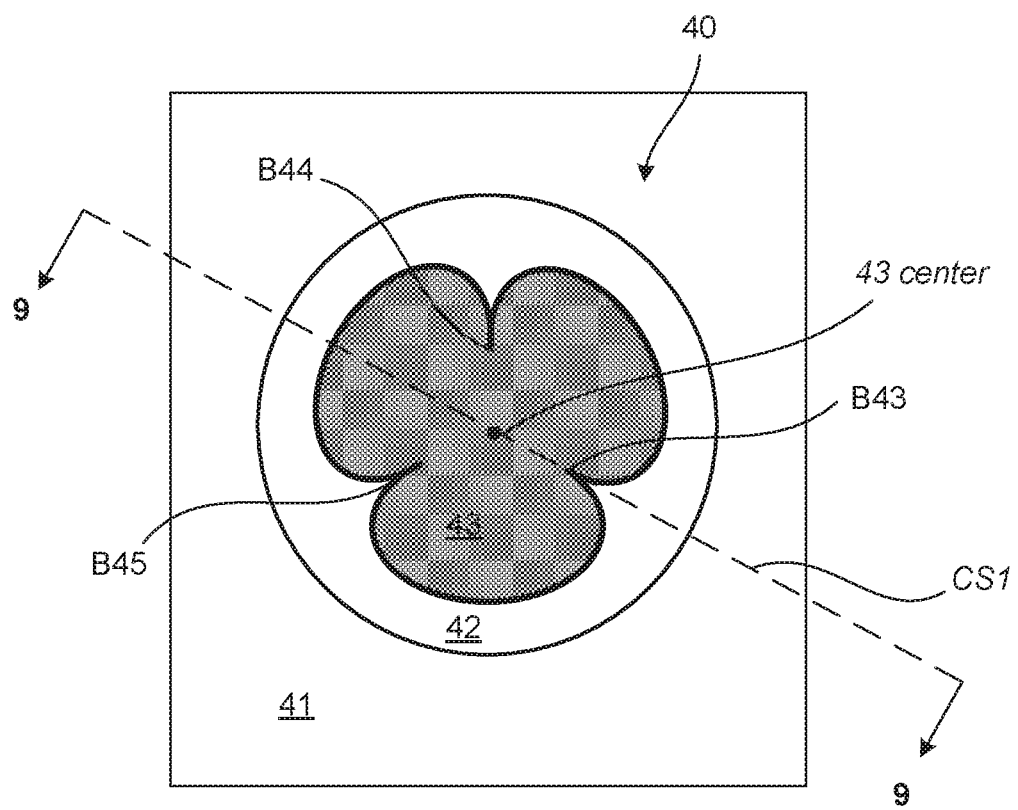
FIGS. 8A, 8B, and 9 depict a top view, angled view, and cross-sectional slice view, respectively, of a probe on a substrate formed via a gray scale etch, in accordance with an exemplary embodiment of the present invention.
Figure 8B:
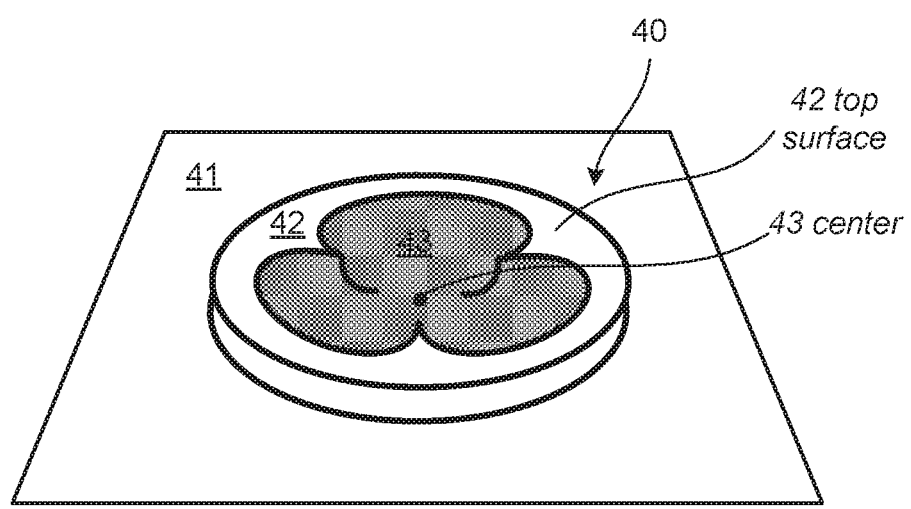

FIGS. 8A and 8B depict a top-down view and an angled view, respectively, of a probe on a substrate. The two views of the probe depicted in FIG. 8A and FIG. 8B show substrate 41 upon which rests probe 40. Probe 40 is composed of any conductive material that can be wet-etched. Examples of such conductive material include one or more of: copper, molybdenum, aluminum, nickel etc. In various embodiments, substrate 41 is composed of an organic material such as FR4 (flame retardant resin composed of epoxy resin) or a ceramic material. Probe 40 includes pad 42 and cavity 43. Cavity 43 is formed via a gray scale etch as described supra and via openings with dimensions and an arrangement substantially similar to openings 10, 11, 12, and 13 as described for FIG. 4. The gray scale etch produces blades B43, B44, and B45.

As described for cavity 14' in FIGS. 5-7, cavity 43 includes three lobes separated by three blades. The three blades B43, B44, and B45 serve to cut through the oxide layer of a C4 bulb. In the example shown in FIGS. 8A and 8B, the symmetry of cavity 43 is $C_3$. Other embodiments of the present invention are not limited to a $C_3$ symmetry. In other words, other embodiments of the present invention include examples where more than three lobes are separated by more than three blades or less than three lobes are separated by less than three blades. Thus, embodiments of the present invention include probes that have one or more blades and one or more lobes. In these alternative embodiments, as is also depicted in the example shown in FIGS. 8A and 8B, the number of lobes equals the number of blades. In the example depicted in FIGS. 8A and 8B, the distance between the center point of cavity 43 (i.e., 43 center) and the top surface of pad 42 (i.e., 42 top surface) is approximately 30 to 35 µm.

In various scenarios, the center point of an probe cavity such as 43 center in probe cavity 43 (FIGS. 8A and 8B) needs to be greater than 30 µm in depth in order to accommodate the upper crown of a C4 bump with a diameter of approximately 100 µm. The challenge of obtaining a cavity with such a depth is that the gray scale etching process must continue until such a depth is obtained while still retaining blades that are sharp enough, and sufficient distance apart, in order to cut through the oxide layer of the accommodated 100 µm diameter C4 bump. The very nature of a gray scale etch involves a simultaneous downward etch through openings in a photoresist as well a lateral etch. The downward etch produces cavity depth while the lateral etch affects blade profile. At some point, allowing a gray scale etch process to proceed until a sufficient depth is produced can also lead to blade erosion such that the blades can no longer effectively cut into the C4 bump. Thus, maintaining a desired blade profile while obtaining a cavity etch greater than 30 µm requires an anisotropic etch profile that can accomplish both feats.

As used herein, the "upper crown," "crown," etc. of a C4 bump refers to the upper portion of the C4 bump that is aligned with the center portion of the probe structure and must be accommodated in order for the blades of the probe structure to contact and, hence, cut through the oxide layer of the C4 bump.

In various embodiments of the present invention, the metal crystal orientation of a metal pad affects a gray scale anisotropic etch profile of the metal pad. For example, the use of electroplated copper to form a probe pad followed by an optimal gray scale etch repeatedly only produces an approximately 23 µm-deep cavity etch while still retaining a useful blade profile. However, if the electroplated copper process is replaced by a rolled annealed copper process, a 33 µm-deep cavity etch can be obtained while still retaining a useful blade profile.

In various embodiments, the use of electroplated copper to form a probe pad is more cost effective from a manufacturing perspective than the use of the rolled annealed copper process. In these embodiments, other processes described infra provide probe structures that include an opening in the center portion of the probe cavity that allows the accommodation of the crown of a 100 µm diameter C4 bump.

Figure 9:
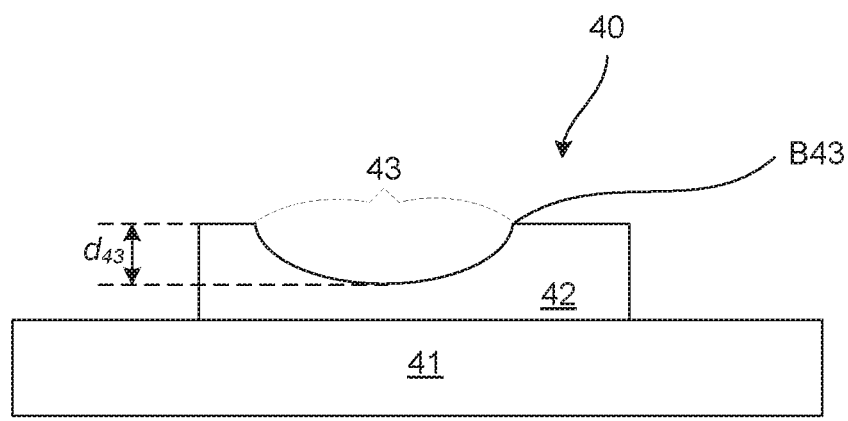

FIG. 9 depicts a cross section view of probe 40 on top of substrate 41 along line CS1 (FIG. 8A). The example depicted in FIG. 9 is a probe formed via a gray scale etch on an electroplated copper pad 42 to form cavity 43. At its deepest, the depth of cavity 43 (i.e., $d_{43}$) is less than 30 µm and, thus, requires a deeper depth in order to accommodate the crown of a 100 µm diameter C4 bump.

Figure 10A:
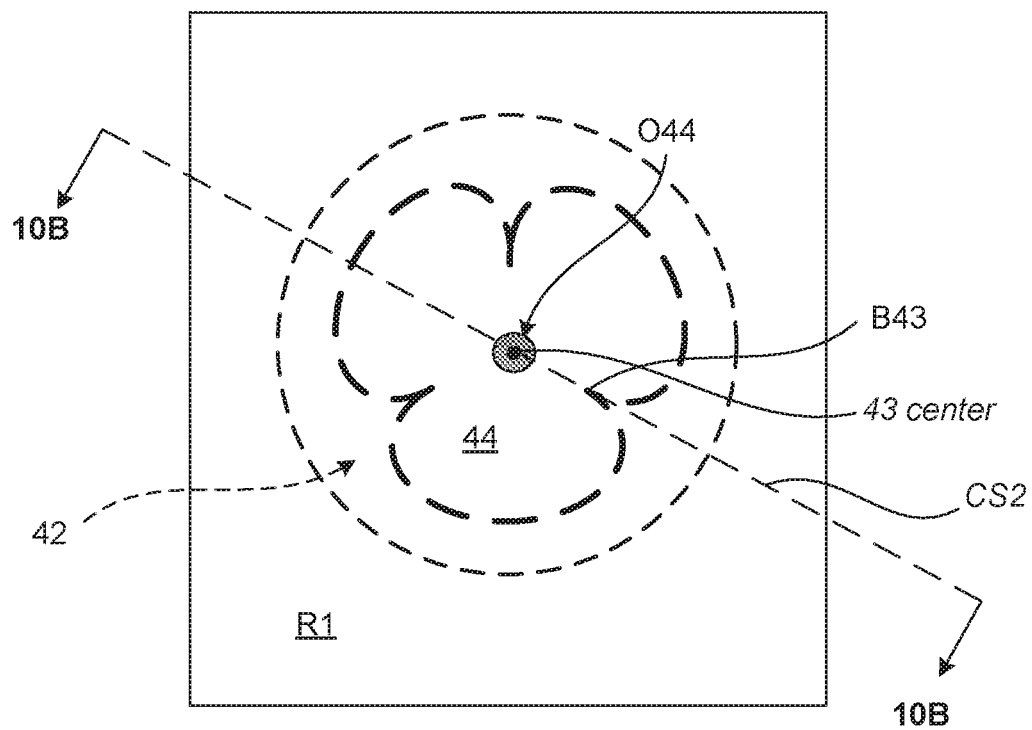
FIGS. 10A and 10B show, respectively, a top view and a cross section slice depicting the formation of a photoresist layer on top of a probe on a substrate followed by lithography to form an opening in the photoresist layer, in accordance with an exemplary embodiment of the present invention.
Figure 10B:
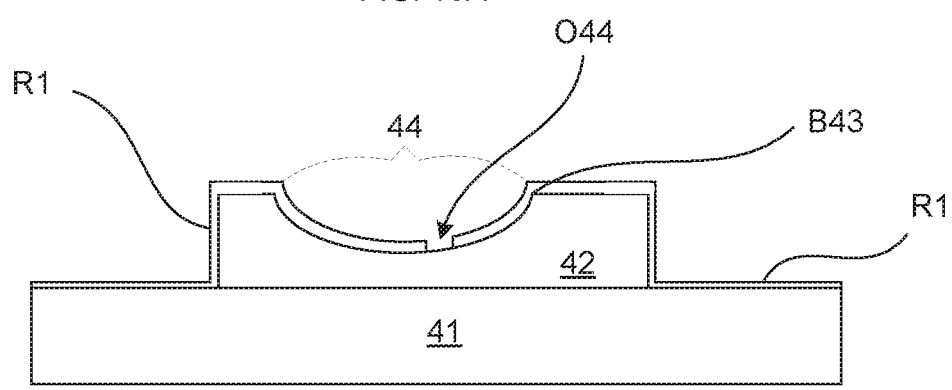

FIGS. 10A and 10B show, respectively, a top view and a cross section view along line CS2 that depicts the formation of photoresist layer R1 on top of probe 40 and substrate 41 followed by lithography to form opening O44.

Figure 11:
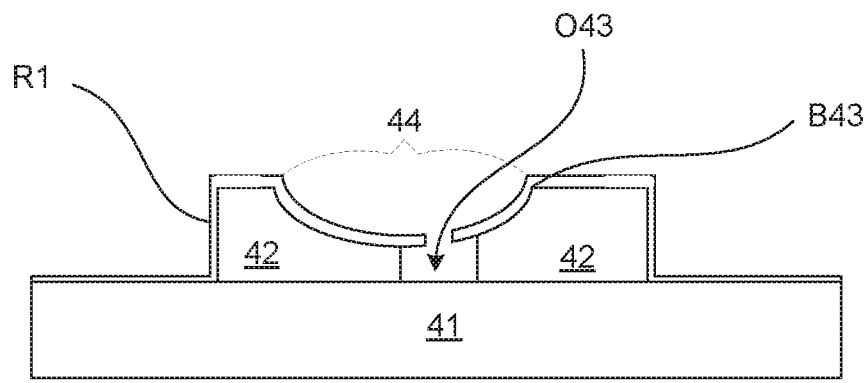
FIG. 11 depicts the formation of an opening via a wet etch of the structure depicted in FIG. 10B, in accordance with an exemplary embodiment of the present invention.

FIG. 11 depicts the formation of opening O43 via a wet etch of the structure depicted in FIG. 10B. Opening O43 is formed by diffusion of etchant through opening O44 both downward as well as laterally.

Figure 12A:
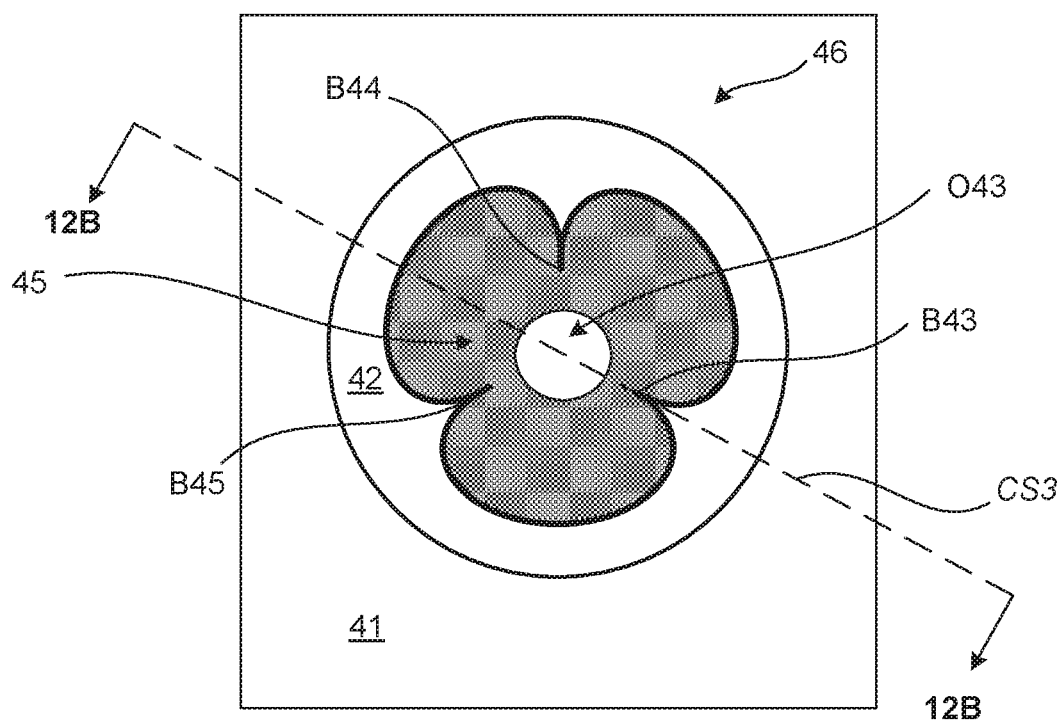
FIGS. 12A and 12B depict, respectively, a top view and a cross section slice of the probe structure in FIG. 11 after removal of the photoresist layer, in accordance with an exemplary embodiment of the present invention.
Figure 12B:
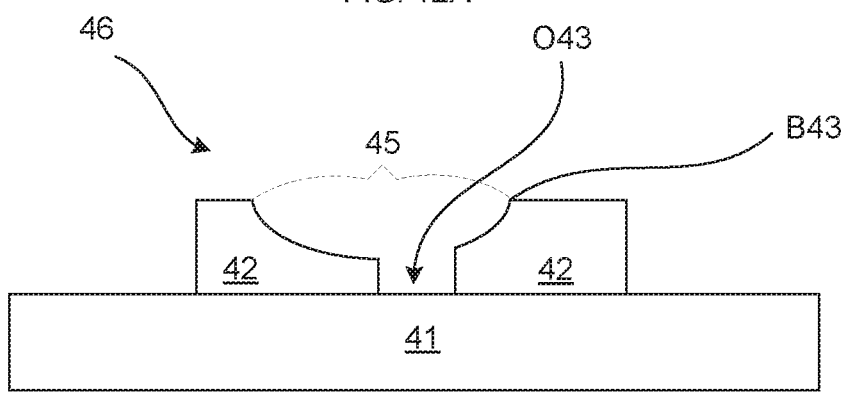

FIGS. 12A and 12B depict, respectively, a top view and a cross section view along line CS3 showing probe structure 46 on substrate 41 after removal of photoresist layer R1. Probe structure 46 includes electroplated copper pad 42, cavity 45 and cavity opening O43. In this embodiment, electroplated copper pad 42 is made of copper. In other embodiments, other conductive materials are used such as, for example, molybdenum and aluminum. Cavity 45 and cavity opening O43 facilitate the accommodation of the crown of a 100 µm diameter C4 bump so that blades B43, B44, and B45 will cut through the outer oxidized layer of the C4 bump during chip testing.

III. Processes and Structures for Multiple-Level Probes

Figure 13:
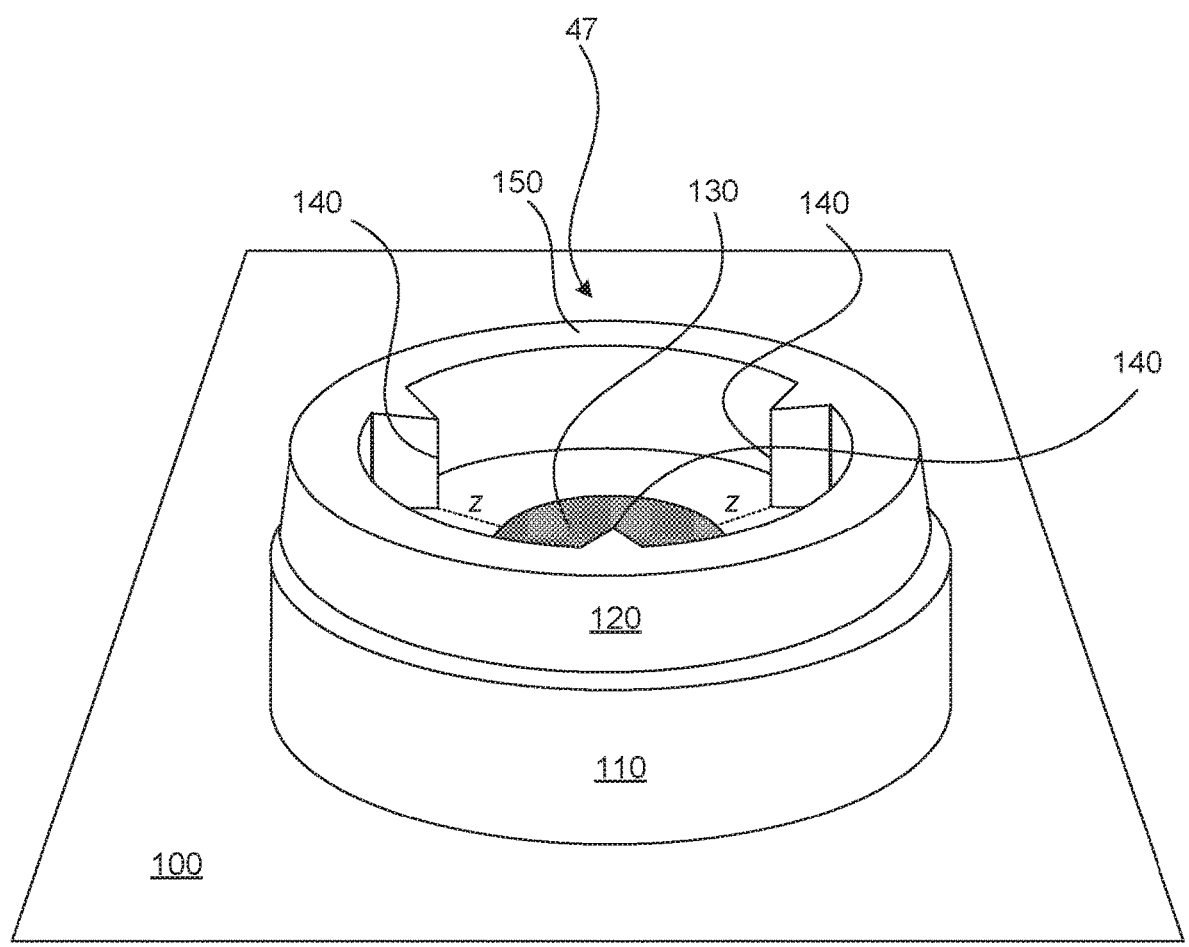
FIG. 13 depicts an example of a probe on a substrate that includes an upper blade structure and a lower base structure, in accordance with an exemplary embodiment of the present invention.

FIG. 13 depicts an example of a probe 47 that includes an upper blade structure 120 and a lower base structure 110, which rests on a substrate 100. Lower base structure 110 includes cavity 130 that allows the accommodation of the crown of a C4 bump so that blades 140 are able to cut through an outer oxide layer of said C4 bump during chip testing. Upper blade structure 120 includes optional supporting wall 150 as well as blades 140. Optional supporting wall 150 provides structural support for blades 140. In other embodiments, optional supporting wall 150 is not included in the probe structure (i.e., individual unconnected triangular blades protrude from lower base structure 110). The tips of blades 140 are a distance z from the outer edge of cavity 130. In various embodiments, distance z ranges from 0 μm (i.e., the tips of blades 140 reach the outer edge of cavity 130) to approximately 10 μm from the outer edge of cavity 130.

In the example shown in FIG. 13, probe 47 has three blades. Other embodiments of the present invention are not limited to a probe structure having three blades. Some of these embodiments include probes that have an upper blade structure analogous to upper blade structure 120, but have more than three blades. Other embodiments include probes that have an upper blade structure analogous to upper blade structure 120, but one or two blades instead of three.

A. Lower Base Structures and Processes

In a first embodiment, lower base structure 110A is formed by initial formation of a toroidal cavity via lithography on top of a substrate followed by filling said toroidal cavity with conductive material.

Figure 14A:
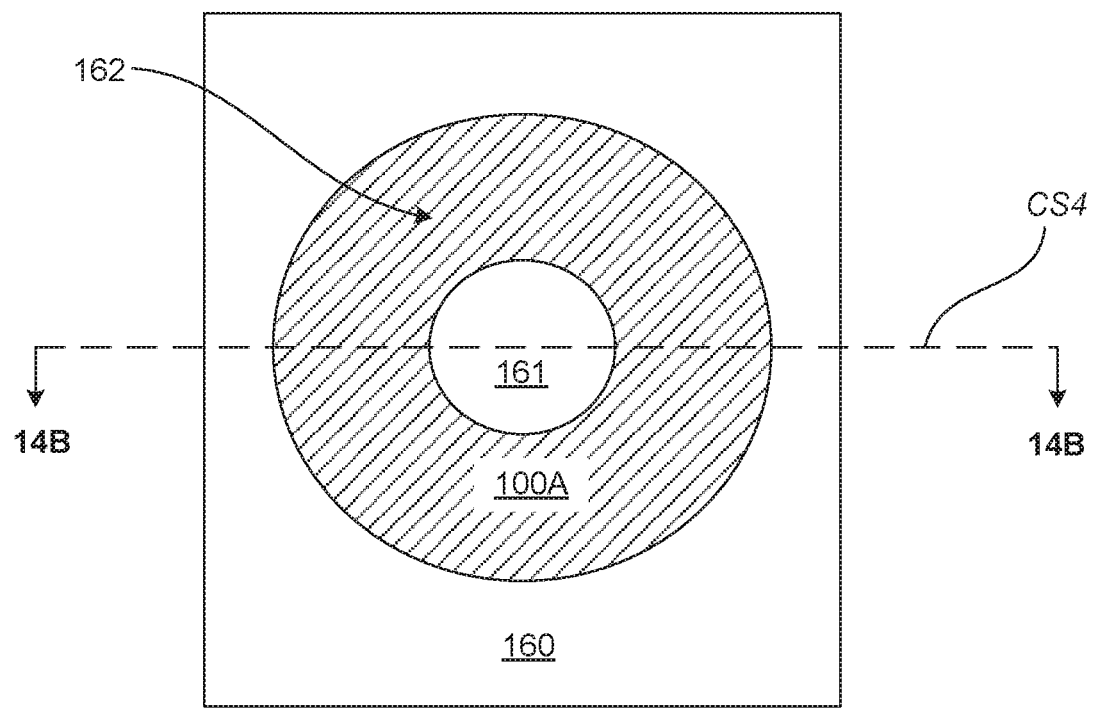
FIGS. 14A and 14B depict, respectively, a top view and a cross sectional slice of the lithographical formation of a toroidal cavity on a substrate, in accordance with an exemplary embodiment of the present invention.
Figure 14B:
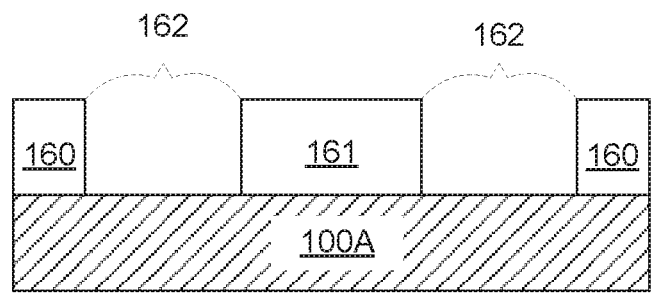

FIGS. 14A and 14B depict, respectively, a top view and a cross sectional view along line CS4 of the lithographical formation of a toroidal cavity 162 on a substrate 100A. Photoresist is deposited on substrate 100A followed by lithography to form toroidal cavity 162 shown in FIGS. 14A and 14B. After lithography, photoresist portion 161 prevents the deposition of conductive material in the future cavity of lower base structure 110A and photoresist portion 160 prevents the deposition of conductive material at the future border of lower base structure 110A.

Figure 15A:
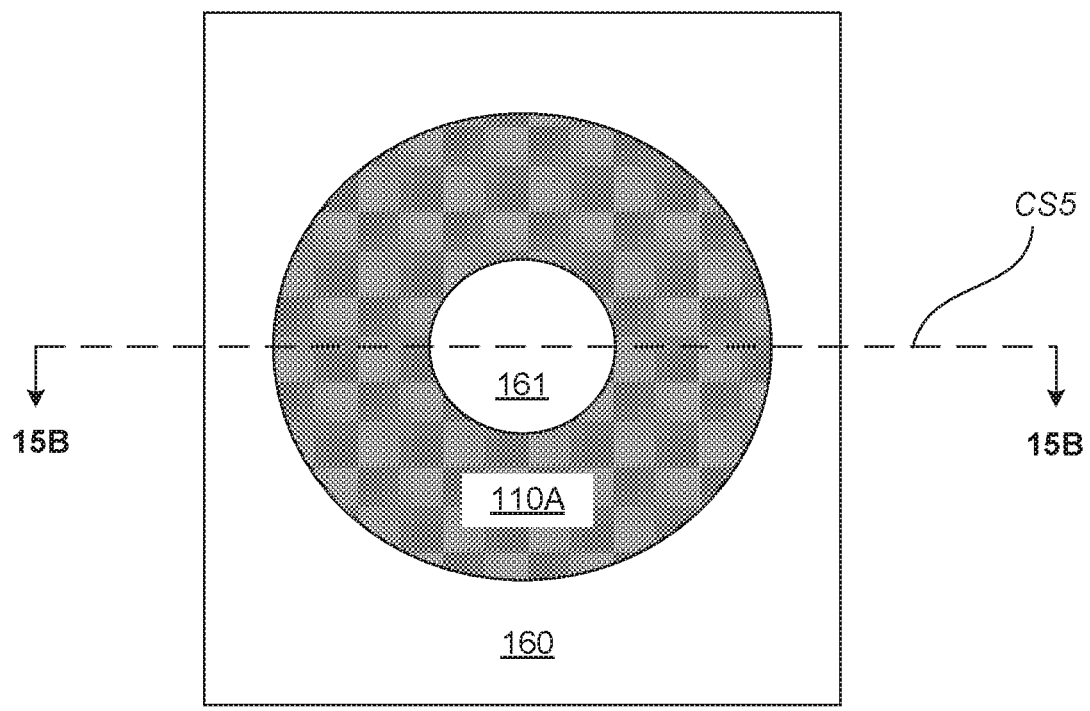
FIGS. 15A and 15B depict, respectively, a top view and a cross sectional slice of the formation of a layer of conductive material on the structure depicted in FIGS. 14A and 14B followed by mechanical planarization to form a lower base structure on top of the substrate, in accordance with an exemplary embodiment of the present invention.
Figure 15B:
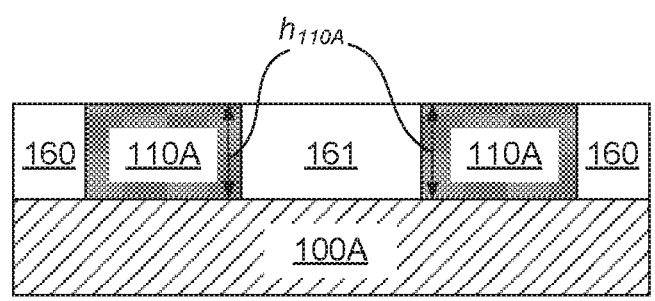

FIGS. 15A and 15B depict, respectively, a top view and a cross sectional view along line CS5 of the formation of a layer of conductive material on the structure depicted in FIGS. 14A and 14B followed by mechanical planarization to form lower base structure 110A on top of substrate 100A. Lower base structure 110A is embedded in photoresist portion 160 and surrounding photoresist portion 161 in FIGS. 15A and 15B. In various embodiments, the depth or height, (i.e., $h_{110A}$) is approximately 40 μm. The conductive material includes one or more of: copper, molybdenum, aluminum, nickel etc.

In a second embodiment, lower base structure 110B is formed by first fabricating a circular probe pad followed by the creation of a cavity in the center of the circular probe pad via a wet etch.

Figure 16A:
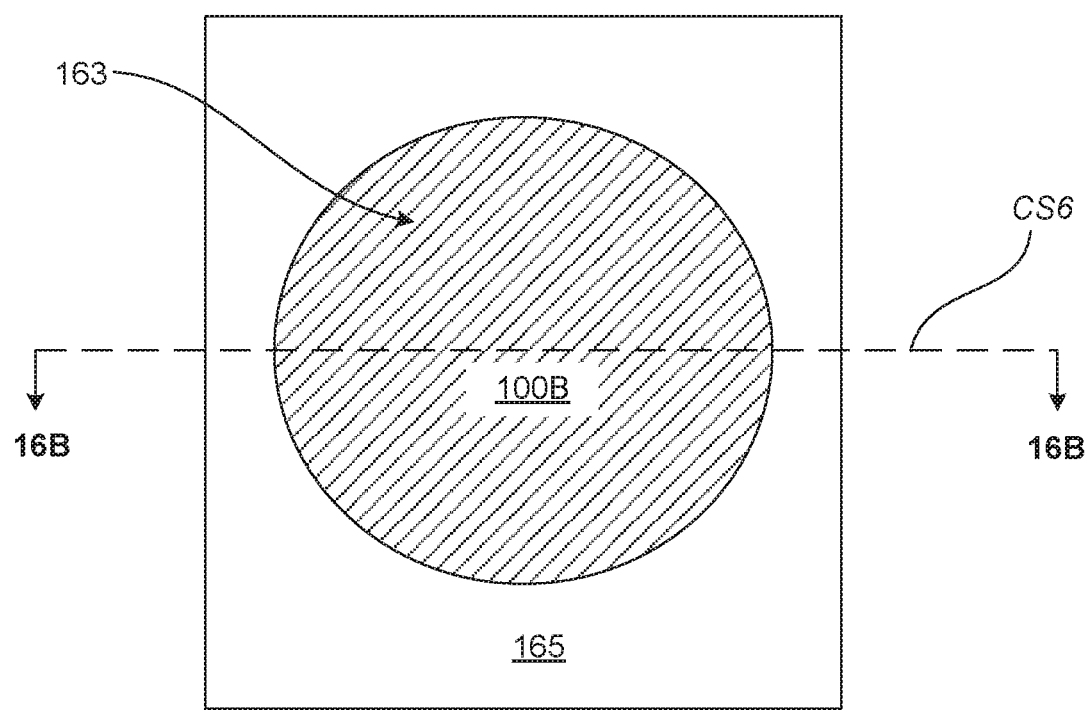
FIGS. 16A and 16B depict, respectively, a top view and a cross sectional slice of the lithographical formation of a circular cavity on a substrate, in accordance with an exemplary embodiment of the present invention.
Figure 16B:
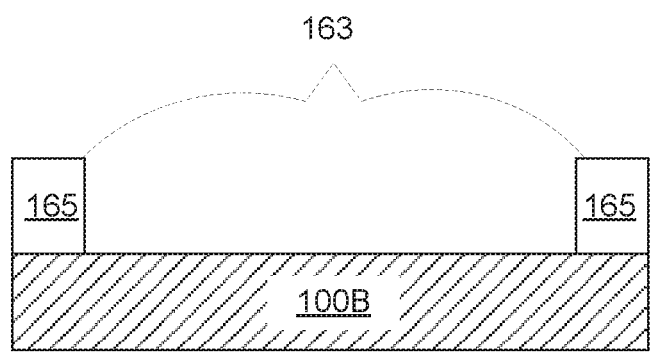

FIGS. 16A and 16B depict, respectively, a top view and a cross sectional view along line CS6 of the lithographical formation of a circular cavity 163 on a substrate 100B. Photoresist 165 is deposited on substrate 100B followed by lithography to form circular cavity 163.

Figure 17A:
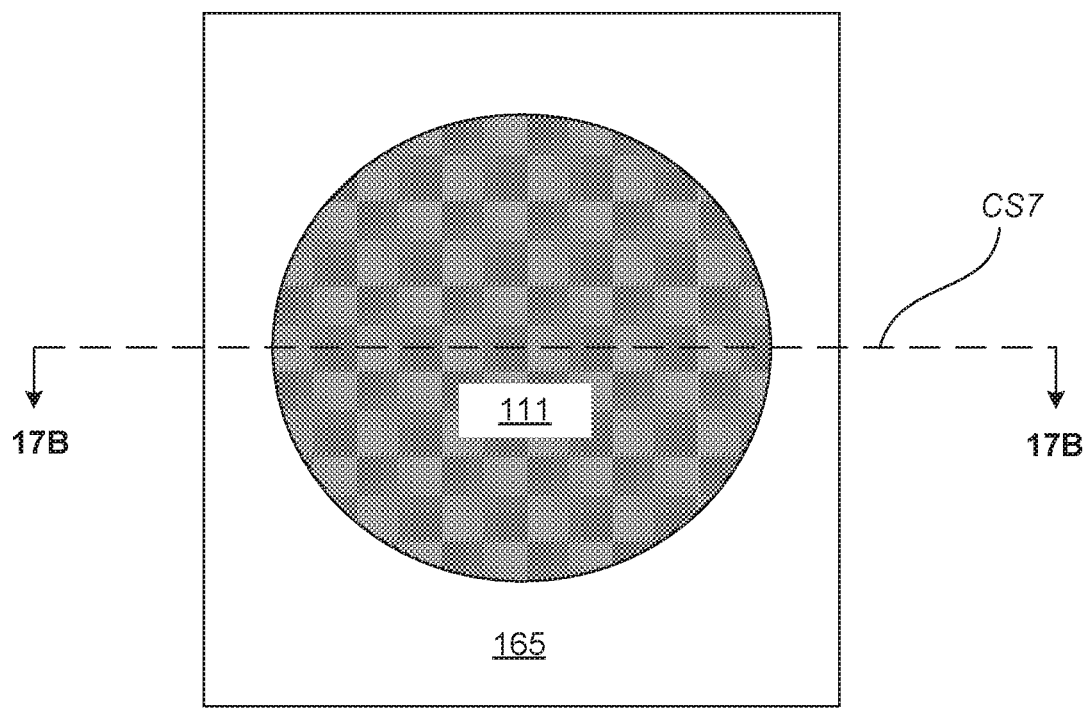
FIGS. 17A and 17B depict, respectively, a top view and a cross sectional slice of the deposition of conductive material onto the structures depicted in FIGS. 16A and 16B followed by mechanical planarization to provide a circular pad on top of the substrate and imbedded in the photoresist layer, in accordance with an exemplary embodiment of the present invention.
Figure 17B:
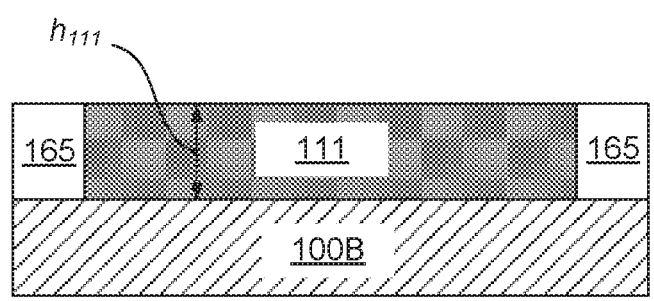

FIGS. 17A and 17B depict, respectively, a top view and a cross sectional view along line CS7 of the deposition of conductive material onto the structures depicted in FIGS. 16A and 16B followed by mechanical planarization to provide circular pad 111 on top of substrate 100B and imbedded in photoresist 165. In various embodiments, the depth or height, (i.e., $h_{111}$) varies from approximately 20 to approximately 40 μm depending on a finished probe structure as described infra. The conductive material includes one or more of: copper, molybdenum, aluminum, nickel etc.

Figure 18A:
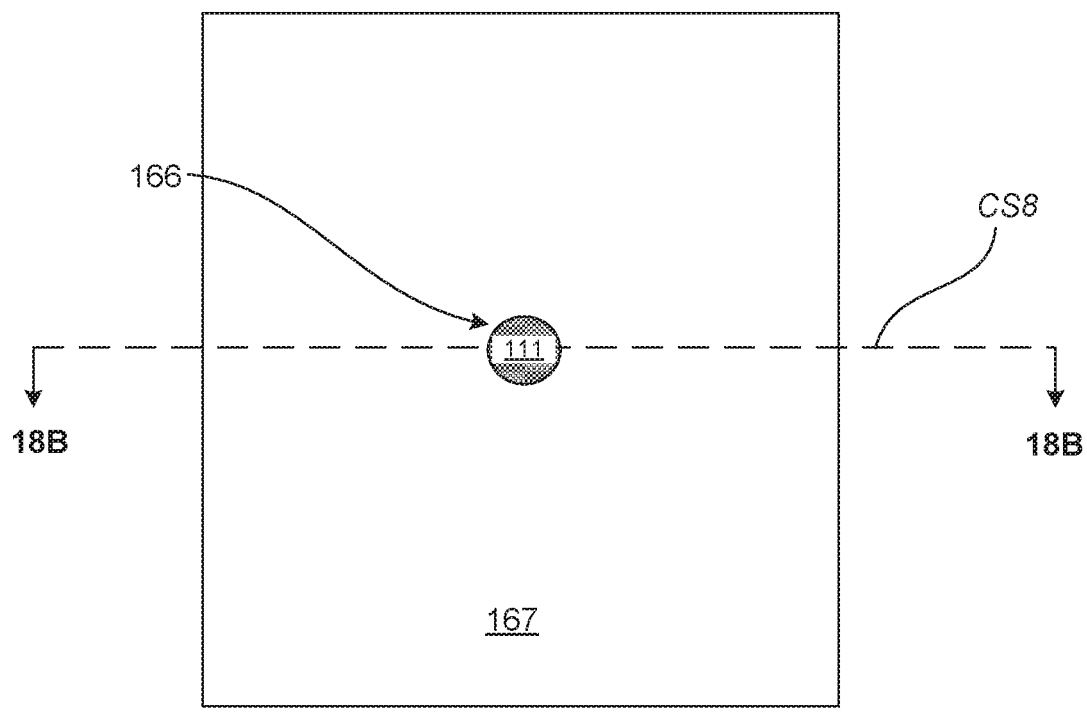
FIGS. 18A and 18B depict, respectively, a top view and a cross sectional slice of the deposition of a photoresist onto the structures depicted in FIGS. 17A and 17B followed by lithography to form an opening, in accordance with an exemplary embodiment of the present invention.
Figure 18B:
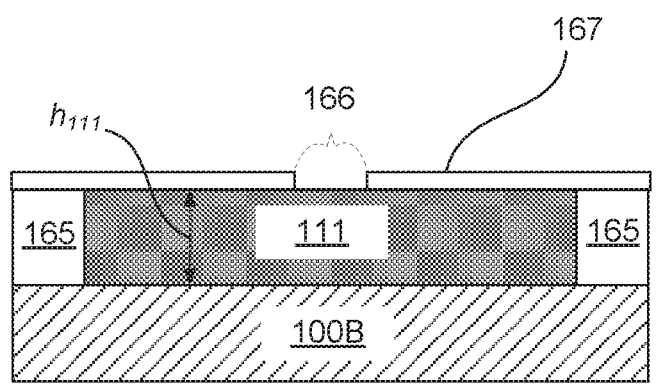

FIGS. 18A and 18B depict, respectively, a top view and a cross sectional view along line CS8 of the deposition of photoresist 167 onto the structures depicted in FIGS. 17A and 17B followed by lithography to form opening 166. In this example, $h_{111}$ is approximately 40 μm.

Figure 19:
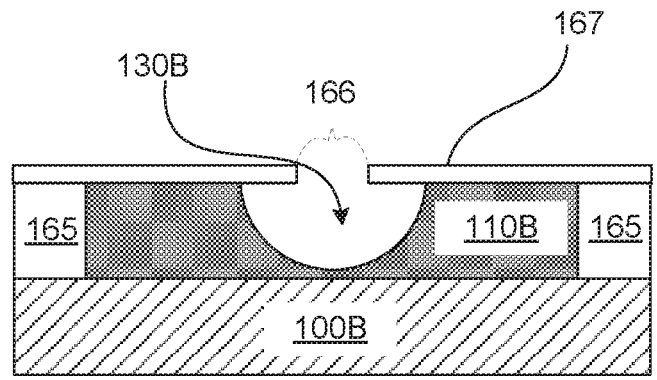
FIG. 19 depicts the formation of cavity via a wet etch of the structure depicted in FIG. 18B, in accordance with an exemplary embodiment of the present invention.

FIG. 19 depicts the formation of cavity 130B via a wet etch of the structure depicted in FIG. 18B. Cavity 130B is formed by etchant diffusion through photoresist opening 166.

Figure 20A:
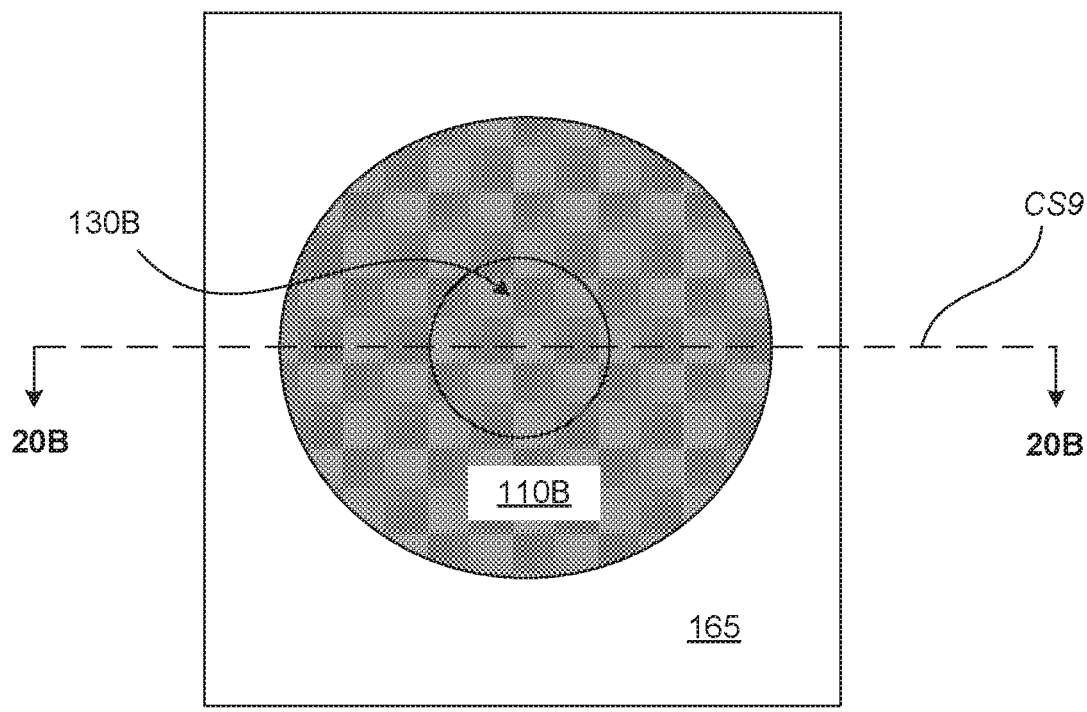
FIGS. 20A and 20B depict, respectively, a top view and a cross sectional slice of the removal of photoresist from the structure depicted in FIG. 19 to provide a lower base structure, in accordance with an exemplary embodiment of the present invention.
Figure 20B:
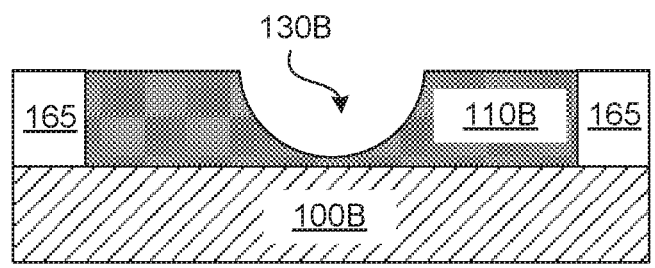

FIGS. 20A and 20B depict, respectively, a top view and a cross sectional view along line CS9 of the removal of photoresist 167 from the structure depicted in FIG. 19 to provide lower base structure 110B embedded in photoresist 165 and on top of substrate 100B. Lower base structure 110B includes cavity 130B.

In a third embodiment, lower base structure 110C is formed by initial formation of a toroidal cavity via lithography on top of circular pad 111 followed by filling said toroidal cavity with conductive material.

Figure 21A:
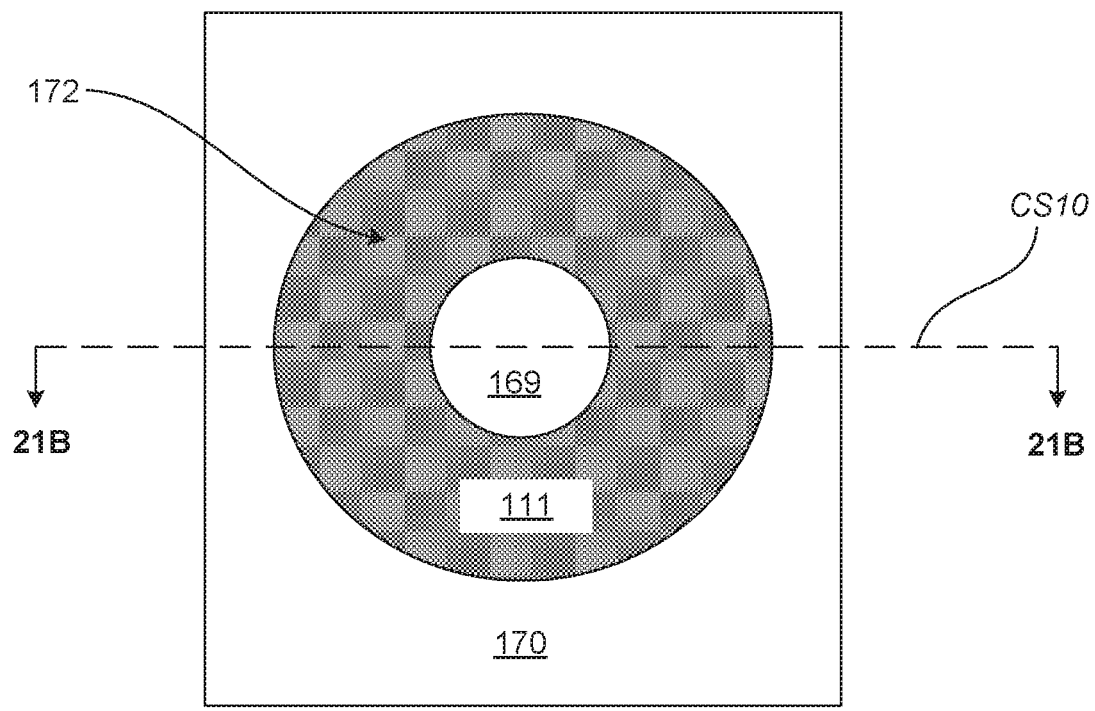
FIGS. 21A and 21B depict, respectively, a top view and a cross sectional slice of the lithographical formation of a toroidal cavity on top of a circular pad, in accordance with an exemplary embodiment of the present invention.
Figure 21B:
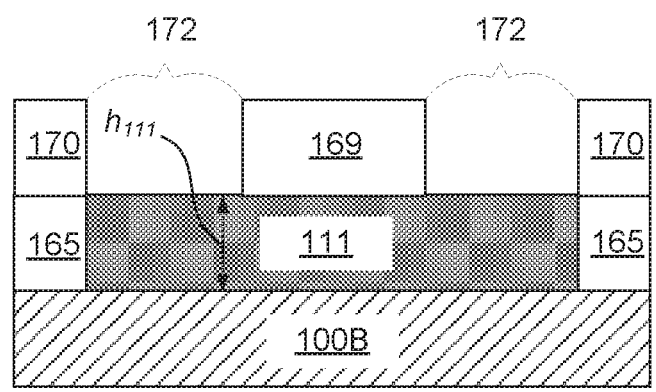

FIGS. 21A and 21B depict, respectively, a top view and a cross sectional slice along line CS10 of the lithographical formation of a toroidal cavity 172 on top of circular pad 111 (FIGS. 17A and 17B). Photoresist is deposited on circular pad 111 followed by lithography to form toroidal cavity 172 shown in FIGS. 21A and 21B. After lithography, photoresist portion 169 prevents the deposition of conductive material in the future cavity of lower base structure 110C and photoresist portion 170 prevents the deposition of conductive material at the future border of lower base structure 110A. In this example, $k_{111}$ is approximately 20 μm.

Figure 22A:
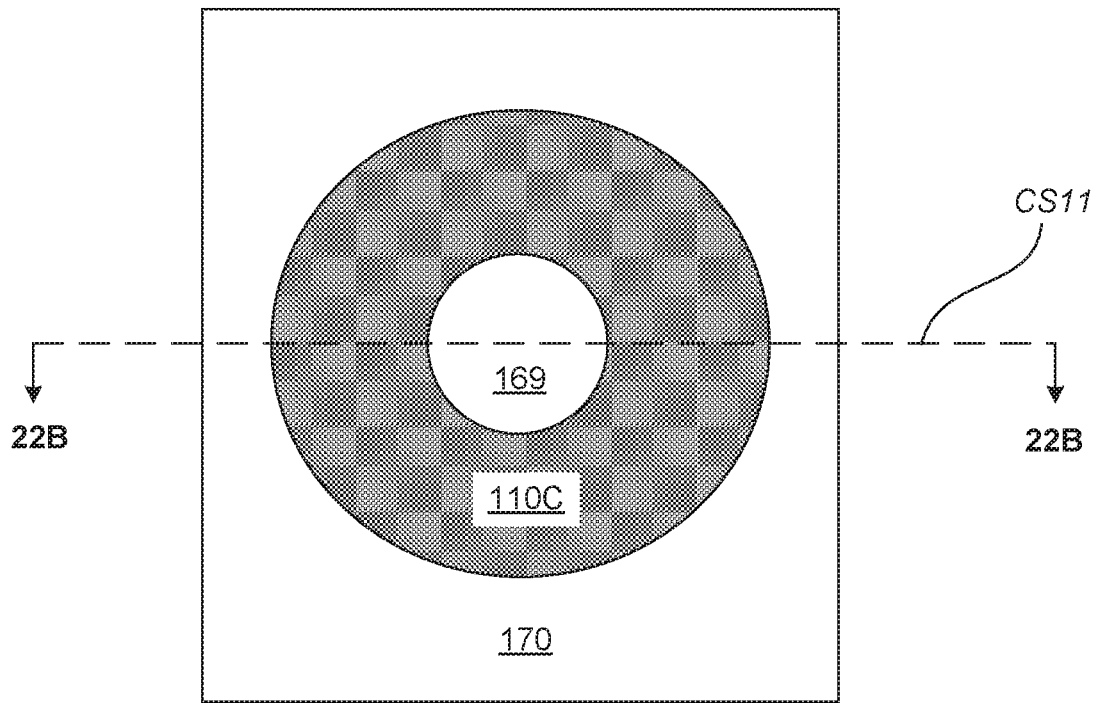
FIGS. 22A and 22B depict, respectively, a top view and a cross sectional slice of the formation of a layer of conductive material on the structure depicted in FIGS. 21A and 21B followed by mechanical planarization to form a lower base structure on top of the substrate, in accordance with an exemplary embodiment of the present invention.
Figure 22B:
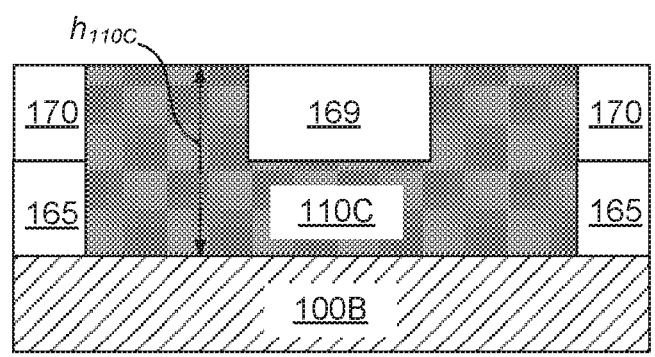

FIGS. 22A and 22B depict, respectively, a top view and a cross sectional slice along line CS11 of the formation of a layer of conductive material on the structure depicted in FIGS. 21A and 21B followed by mechanical planarization to form lower base structure 110C on top of substrate 100B. Lower base structure 110C, as depicted in FIGS. 22A and 22B, is the combination of the conductive material present in circular pad 111 and the conductive material deposited in toroidal cavity 172 (FIGS. 21A and 22B). Thus, in some embodiments, lower base structure 110C is composed of two conductive materials, i.e., the conductive material used to form circular pad 111 and the conductive material used to fill in toroidal cavity 172. The conductive materials include one or more of: copper, molybdenum, aluminum, etc. In the example depicted in FIGS. 22A and 22B, the height of lower base structure 110C (i.e., $h_{110C}$) is approximately 30 μm.

B. Upper Blade Structures and Processes

Figure 23A:
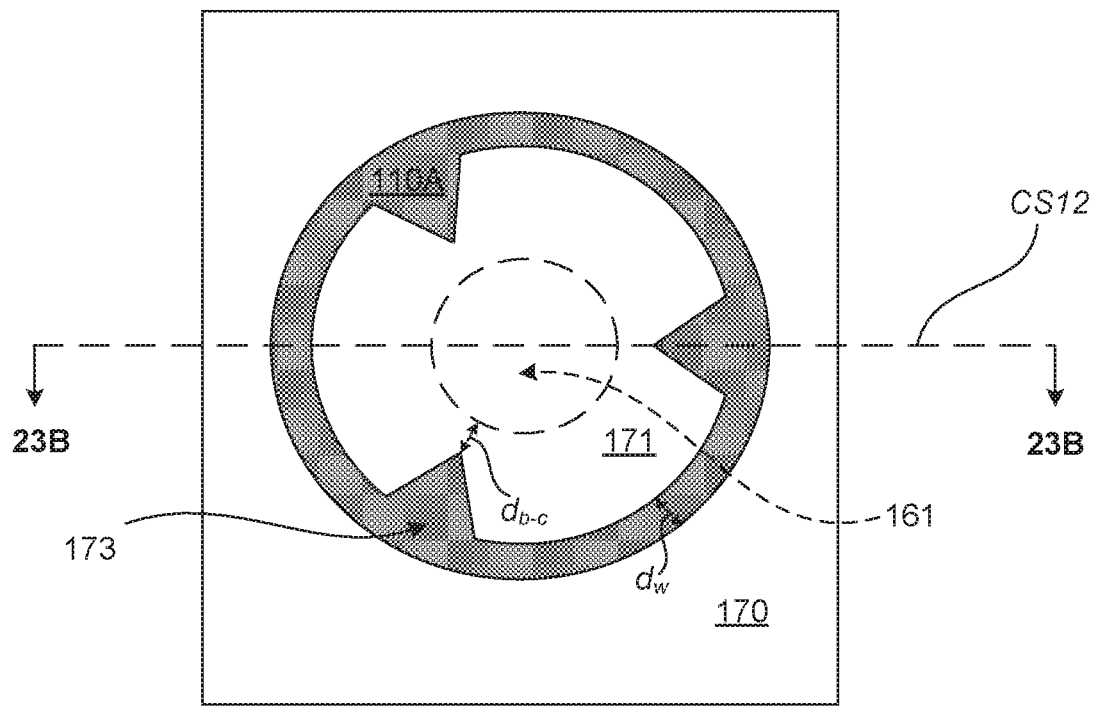
FIGS. 23A and 23B depict, respectively, a top view and a cross sectional slice of the formation of a blade cavity, in accordance with an exemplary embodiment of the present invention.
Figure 23B:
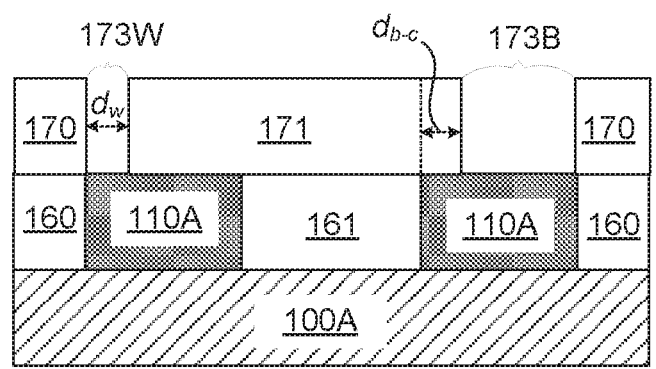

FIGS. 23A and 23B depict, respectively, a top view and a cross sectional slice along line CS12 of the formation of blade cavity 173. In this example, a photoresist layer is deposited on top of the structure depicted in FIGS. 15A and 15B followed by lithography to form photoresist portions 170 and 171. Lithography removes portions of the photoresist layer to provide blade cavity 173. As depicted in FIG. 23A, blade cavity 173 includes openings for the eventual formation of three blades and a supporting wall. As illustrated in FIG. 23B, the supporting wall portions of blade cavity 173 have a narrower gap (173W) between photoresist portions 170 and 171 as opposed to the blade portions of blade cavity 173 (see 173B).

In various embodiments, the distance gap $d_w$ between the support wall portions ranges from 0 μm to approximately 10 μm. Embodiments where $d_w$ is equal to 0 μm do not have supporting wall portions of blade cavity 173. In other words, these embodiments just have three separate triangular blade cavities. In various embodiments, the distance between each tip of the blade portions of blade cavity 173 and the edge of lower base structure 110A (i.e., $d_{b-c}$) ranges from 0 µm to approximately 10 µm. The example depicted in FIGS. 23A and 23B includes a cavity with three blade portions. Other embodiments of the present invention include more than three blade portions as well as just one or two blade portion(s).

Figure 24A:
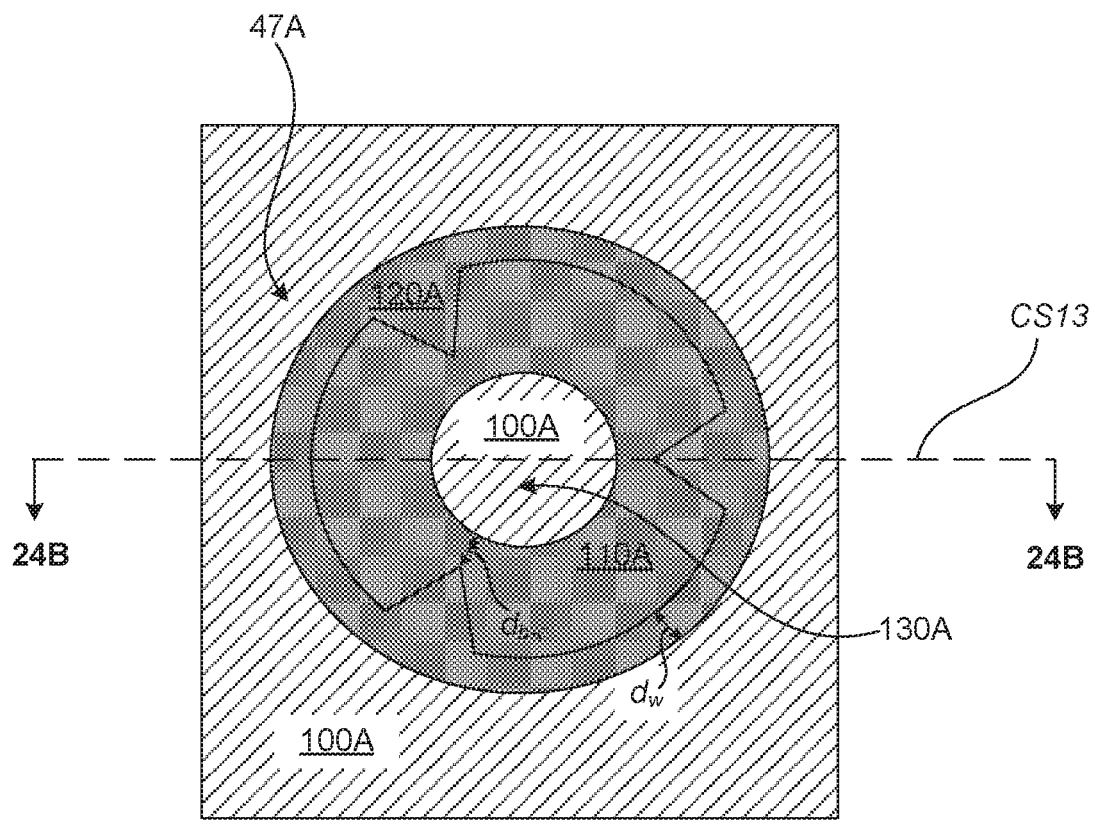
FIGS. 24A and 24B depict, respectively, a top view and a cross sectional slice of a first example of the formation of an upper blade structure on top of a lower base structure, in accordance with an exemplary embodiment of the present invention.
Figure 24B:
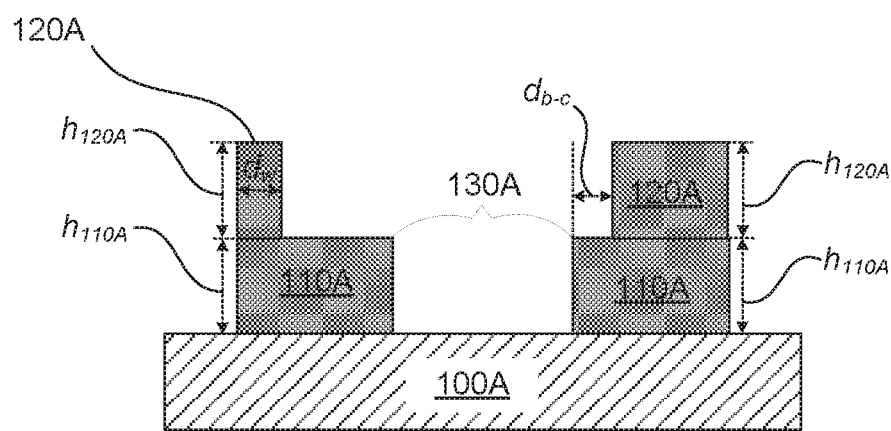

FIGS. 24A and 24B depict, respectively, a top view and a cross sectional slice along line CS13 of the formation of upper blade structure 120A on top of lower base structure 110A to provide probe 47A on top of substrate 100A. In this example, upper blade structure 120A is formed by deposition of conductive material on top of the structure depicted in FIGS. 23A and 23B followed by mechanical planarization and photoresist removal. The conductive material includes one or more of: copper, molybdenum, aluminum, rhodium, palladium-cobalt alloy etc. As depicted in FIG. 24A, upper blade structure 120A includes three blades and a supporting wall. As illustrated in FIG. 24B, the supporting wall portions of upper blade structure 120A have a narrower width as opposed to the blade portions of upper blade structure 120A. In various embodiments, the supporting wall width $d_w$ ranges from 0 µm to approximately 10 µm. Embodiments where $d_w$ is equal to 0 µm do not have a supporting wall. In other words, these embodiments have three separate triangular blades on top of lower base structure 110A.

In various embodiments, the distance between each tip of the blade portions of upper blade structure 120A and the inner edge of lower base structure 110A (i.e., $d_{b-c}$) ranges from 0 µm to approximately 10 µm. The finished probe structure exemplified by FIGS. 24A and 24B are composed of a lower base structure 110A with a height (i.e., $h_{120A}$) of approximately 40 µm and an upper blade structure 120A with a height (i.e., $h_{120A}$) of approximately 20 µm. The example depicted in FIGS. 24A and 24B includes three blades. Other embodiments of the present invention include more than three blades as well as just one or two blade(s). As depicted in FIGS. 24A and 24B, lower base structure 110A includes cavity 130A in order to accommodate the crown of a 100 µm C4 bump. Cavity 130A is cylindrical in shape. Some embodiments include coating the lower base structure and upper blade structure with a hard metal such as nickel, rhodium, palladium-cobalt alloy, etc. after the photoresist has been removed.

Figure 25A:
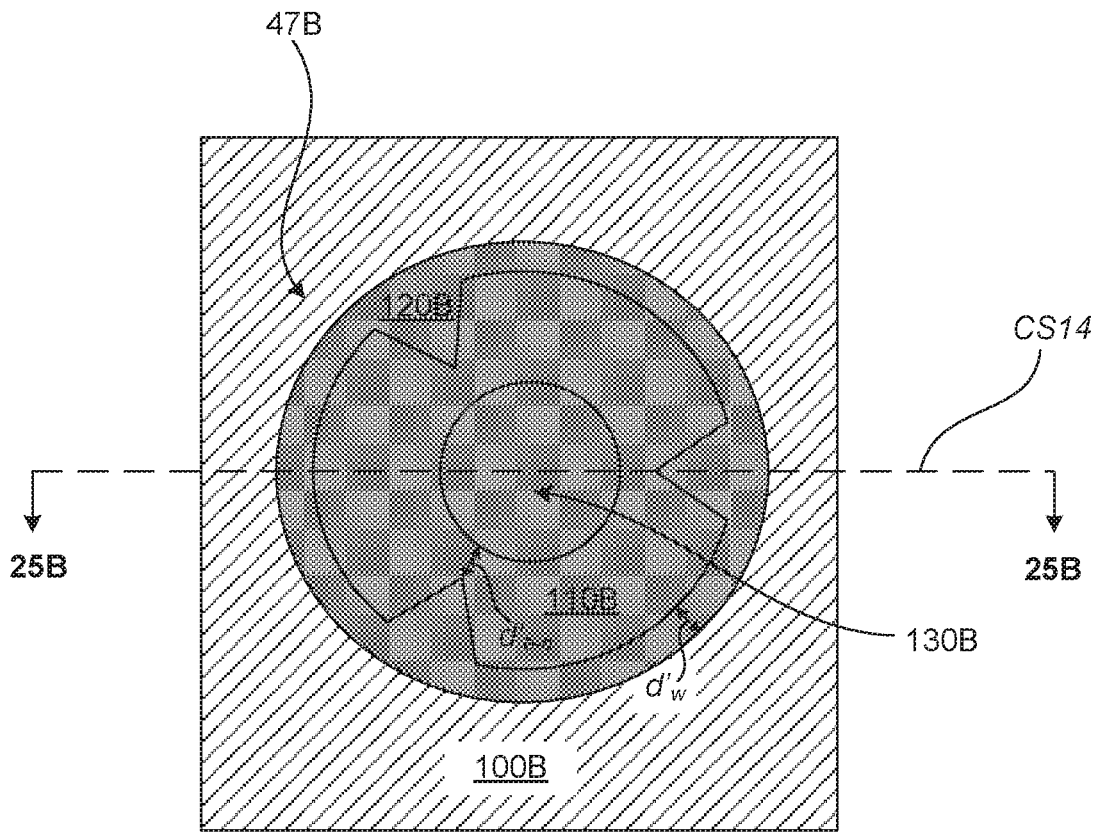
FIGS. 25A and 25B depict, respectively, a top view and a cross sectional slice of a second example of the formation of an upper blade structure on top of a lower base structure, in accordance with an exemplary embodiment of the present invention.
Figure 25B:
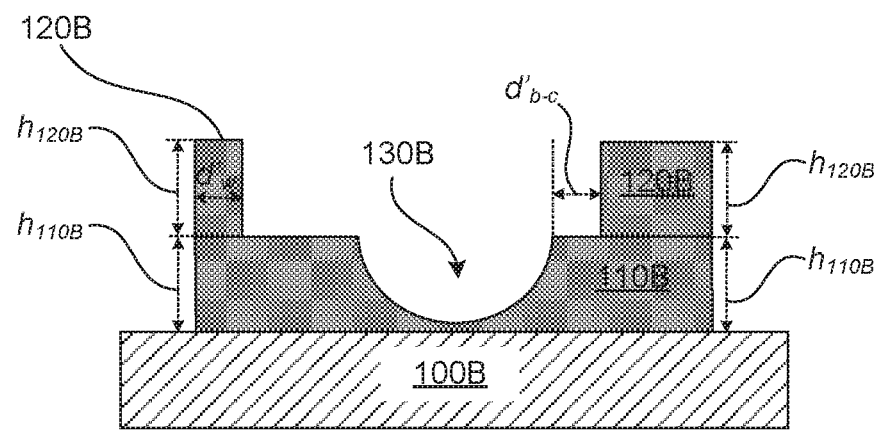

FIGS. 25A and 25B depict, respectively, a top view and a cross sectional slice along line CS14 of the formation of upper blade structure 120B on top of lower base structure 110B to provide probe 47B on top of substrate 100B. The process for formation of probe 47B from the structure depicted in FIGS. 20A and 20B follows a substantially similar process as the formation of probe 47A from the structure depicted in FIGS. 15A and 15B: i) photoresist is deposited upon the structure depicted in FIGS. 20A and 20B; ii) lithography is used to create a blade cavity substantially similar to blade cavity 173 (FIGS. 23A and 23B); iii) the blade cavity is filled with a conductive material and planarized; and iv) removal of all photoresist material to provide probe 47B on top of substrate 100B. The conductive material includes one or more of: copper, molybdenum, aluminum, rhodium, palladium-cobalt alloy etc.

As depicted in FIG. 25A, upper blade structure 120B includes three blades and a supporting wall. As illustrated in FIG. 24B, the supporting wall portions of upper blade structure 120B have a narrower width as opposed to the blade portions of upper blade structure 120B. In various embodiments, the supporting wall width $d'_w$ ranges from 0 µm to approximately 10 µm. Embodiments where $d'_w$ is equal to 0 µm do not have a supporting wall. In other words, those embodiments have three separate triangular blades on top of lower base structure 110B. In various embodiments, the distance between each tip of the blade portions of upper blade structure 120B and the inner edge of lower base structure 110B (i.e., $d'_{b-c}$) ranges from 0 µm to approximately 10 µm.

The finished probe structure exemplified by FIGS. 25A and 25B are composed of a lower base structure 110B with a height (i.e., $h_{110B}$) of approximately 40 µm and an upper blade structure 120B with a height (i.e., $h_{120B}$) of approximately 20 µm. The example depicted in FIGS. 25A and 25B includes three blades. Other embodiments of the present invention include more than three blades as well as just one or two blade(s). As depicted in FIGS. 25A and 25B, lower base structure 110B includes cavity 130B in order to accommodate the crown of a 100 µm C4 bump. Cavity 130B is bowl-shaped because it is formed via a wet-etch (see FIG. 9). Some embodiments include coating the lower base structure and upper blade structure with a hard metal such as nickel, rhodium, palladium-cobalt alloy, etc. after the photoresist has been removed.

Figure 26A:
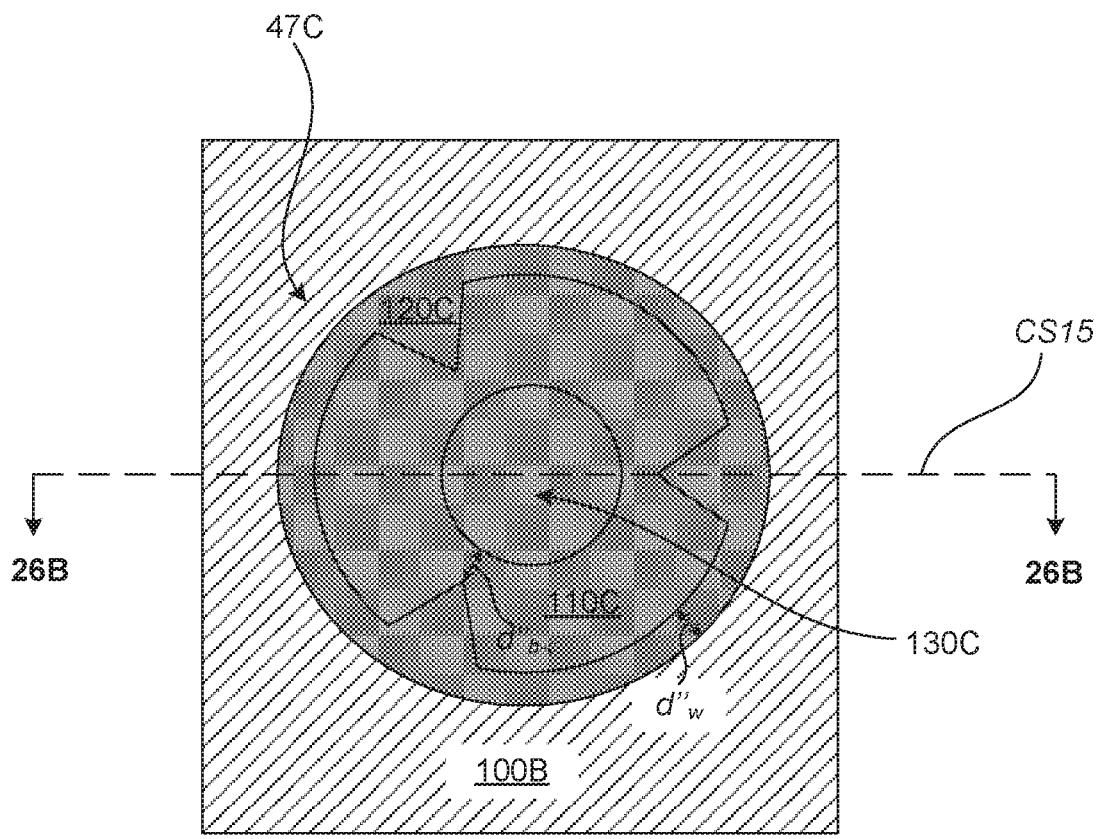
FIGS. 26A and 26B depict, respectively, a top view and a cross sectional slice of a third example of the formation of an upper blade structure on top of a lower base structure, in accordance with an exemplary embodiment of the present invention.
Figure 26B:
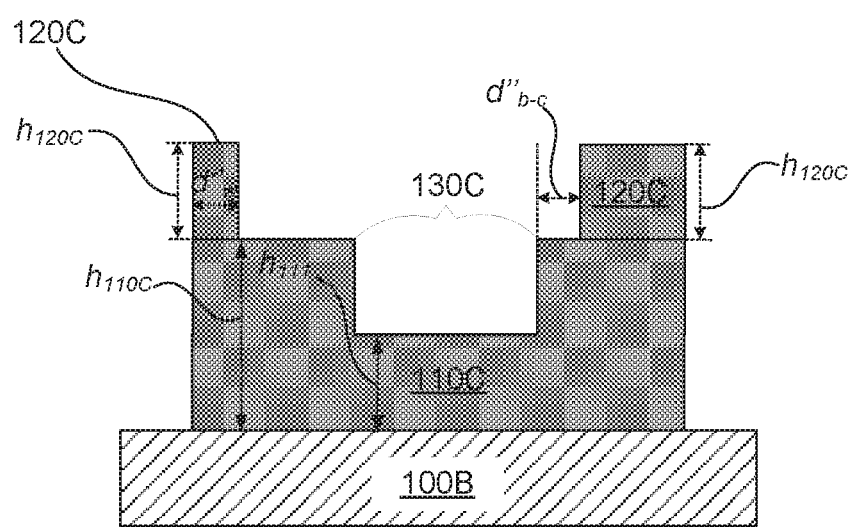

FIGS. 26A and 26B depict, respectively, a top view and a cross sectional slice along line CS15 of the formation of upper blade structure 120C on top of lower base structure 110C to provide probe 47C on top of substrate 100B. The process for formation of probe 47C from the structure depicted in FIGS. 22A and 22B follows a substantially similar process as the formation of probe 47A from the structure depicted in FIGS. 15A and 15B: i) photoresist is deposited upon the structure depicted in FIGS. 22A and 22B; ii) lithography is used to create a blade cavity substantially similar to blade cavity 173 (see FIGS. 23A and 23B); iii) the blade cavity is filled with a conductive material and planarized; and iv) removal of all photoresist material to provide probe 47C on top of substrate 100B. The conductive material includes one or more of: copper, molybdenum, aluminum, rhodium, palladium-cobalt alloy etc.

As depicted in FIG. 26A, upper blade structure 120C includes three blades and a supporting wall. As illustrated in FIG. 26B, the supporting wall portions of upper blade structure 120C have a narrower width as opposed to the blade portions of upper blade structure 120C. In various embodiments, the supporting wall width $d''_w$ ranges from 0 µm to approximately 10 µm. Embodiments where $d''_w$ is equal to 0 µm do not have a supporting wall. In other words, these embodiments have three separate triangular blades on top of lower base structure 110C. In various embodiments, the distance between each tip of the blade portions of upper blade structure 120C and the inner edge of lower base structure 110C (i.e., $d''_{b-c}$) ranges from 0 µm to approximately 10 µm.

The finished probe structure exemplified by FIGS. 26A and 26B are composed of a lower base structure 110C with a height (i.e., $h_{110C}$) of approximately 30 µm between the upper blade structure 120C and substrate 100B, a height of approximately 20 µm between the base of cavity 130C and substrate 100B (i.e., $h_{111}$), and an upper blade structure 120C with a height (i.e., $h_{120C}$) of approximately 20 µm. The example depicted in FIGS. 26A and 26B includes three blades. Other embodiments of the present invention include more than three blades as well as just one or two blade(s). As depicted in FIGS. 26A and 26B, lower base structure 110C includes cavity 130C in order to accommodate the crown of a 100 µm C4 bump. Cavity 130A is cylindrical in shape. Some embodiments include coating the lower base structure and upper blade structure with a hard metal such as nickel, rhodium, palladium-cobalt alloy, etc. after the photoresist has been removed.

Figure 27A:
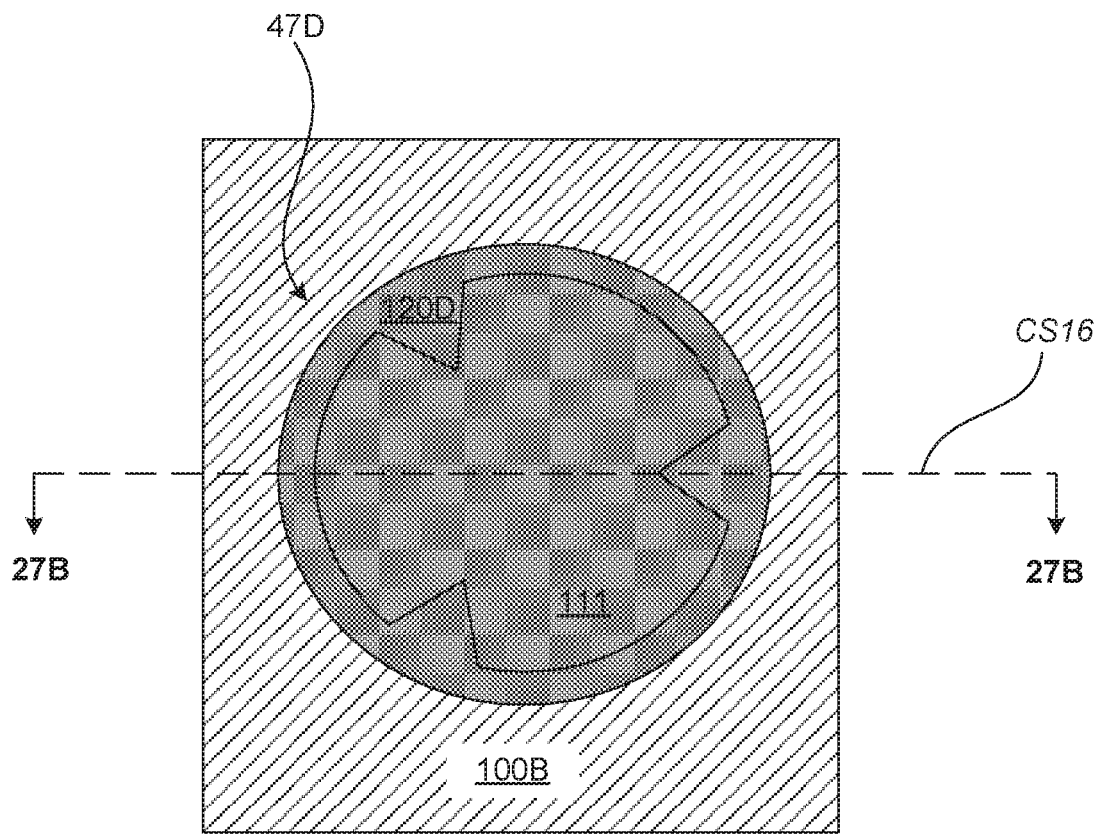
FIGS. 27A and 27B depict, respectively, a top view and a cross sectional slice of a fourth example of the formation of an upper blade structure on top of a lower base structure, in accordance with an exemplary embodiment of the present invention.
Figure 27B:
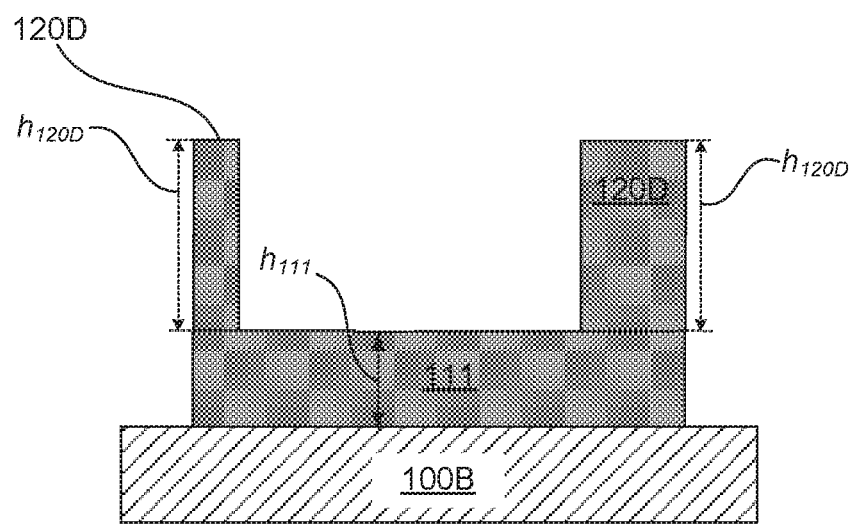

FIGS. 27A and 27B depict, respectively, a top view and a cross sectional slice along line CS16 of the formation of upper blade structure 120D on top of lower base structure 111 to provide probe 47D on top of substrate 100B. The process for formation of probe 47D from the structure depicted in FIGS. 17A and 17B follows a substantially similar process as the formation of probe 47A from the structure depicted in FIGS. 15A and 15B: i) photoresist is deposited upon the structure depicted in FIGS. 17A and 17B; ii) lithography is used to create a blade cavity substantially similar to blade cavity 173 (see FIGS. 23A and 23B); iii) the blade cavity is filled with a conductive material and planarized; and iv) removal of all photoresist material to provide probe 47D on top of substrate 100B. The conductive material includes one or more of: copper, molybdenum, aluminum, rhodium, palladium-cobalt alloy etc.

The finished probe structure exemplified by FIGS. 27A and 27B are composed of a lower base structure (circular pad 111) with a height (i.e., hip) of approximately 20 µm between the upper blade structure 120D and substrate 100B and an upper blade structure 120D with a height (i.e., $h_{120D}$) of at least approximately 35 µm. The example depicted in FIGS. 27A and 27B includes three blades. Other embodiments of the present invention include more than three blades as well as just one or two blade(s). In contrast to the structures depicted in FIGS. 24A, 24B, 25A, 25B, 26A, and 26B, the structure shown in FIGS. 27A and 27B does not include a cavity in the lower base structure (i.e., circular pad 111). In this embodiment, the height of upper blade structure 120D (35 µm or greater) is large enough to allow cutting through the oxide layer of a 100 µm C4 bump without requiring a cavity in the lower base structure in order to accommodate the crown of the C4 bump. Some embodiments include coating the lower base structure and upper blade structure with a hard metal such as nickel, rhodium, palladium-cobalt alloy, etc. after the photoresist has been removed.

In exemplary embodiments, the finished probes described in FIGS. 13, 24A-B, 25A-B, 26A-B, and 27A-B are subjected to a final coating with an oxide-free metal such as gold to ensure low contact resistance during probing. These embodiments include the use of copper plating for the lower base structures and the upper blade structures followed by nickel coating for hardness and strength and then a final gold coating to provide low contact resistance.

C. Blade Sharpening

In various embodiments of the present invention, fabrication of the upper blade structures of probes provides blade tips that are rounded when observed at the microscopic scale. In some of these embodiments, the blade tips are sharpened by optical proximity correction (OPC).

Figure 28:
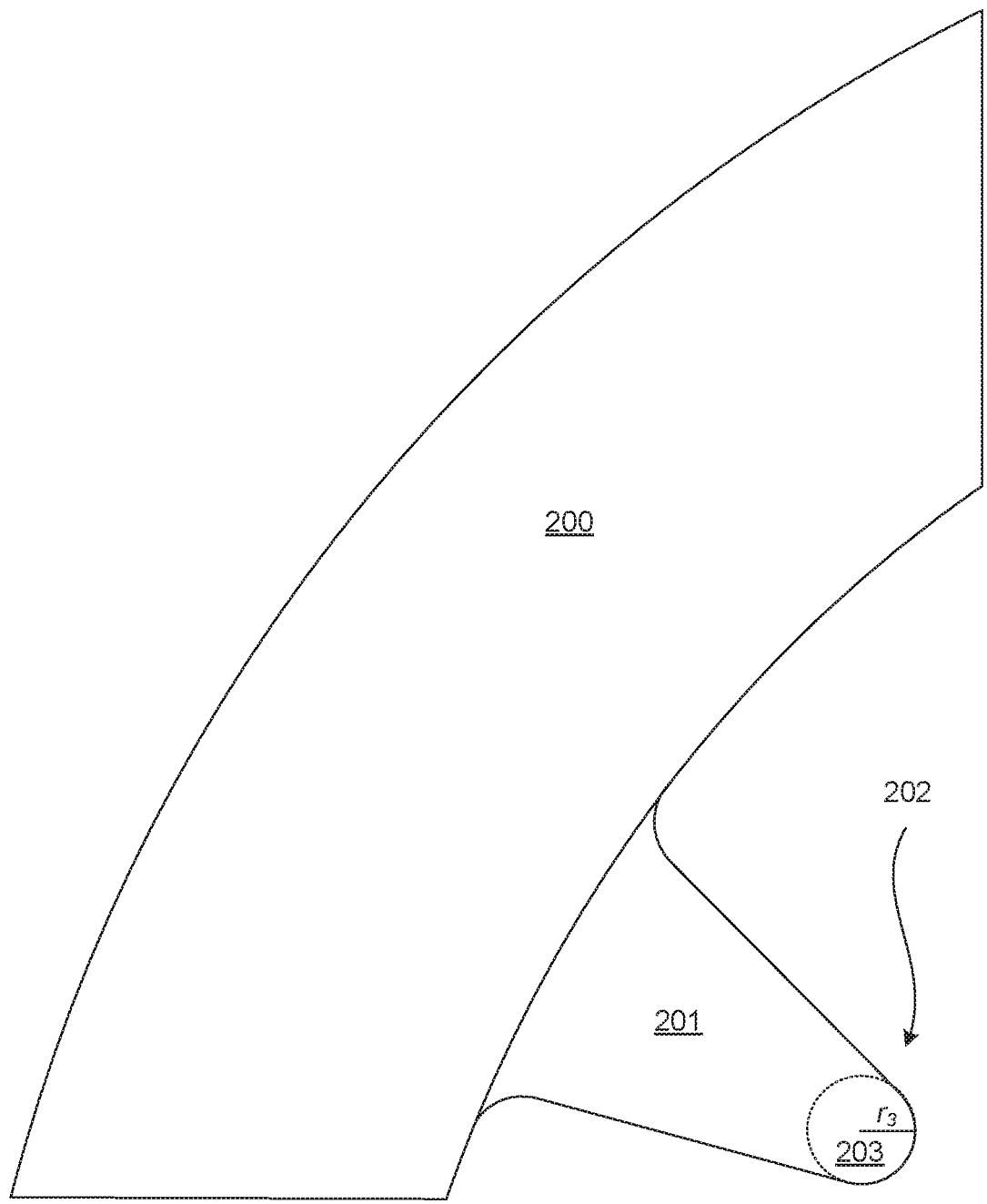
FIG. 28 depicts an example of a rounded blade tip as observed microscopically, in accordance with an exemplary embodiment of the present invention.

FIG. 28 depicts an example of a rounded blade tip as observed microscopically. Included in the structure depicted by FIG. 28 is supporting wall portion 200 and blade 201. Blade 201 has a rounded blade tip 202, the sharpness of which can be determined by radius $r_3$ of overlapping circle 203. Rounded blade tip 202 becomes sharper as the radius $r_3$ of overlapping circle 203 becomes smaller. In this example, $r_3$ of rounded blade tip 202 is approximately 4 µm after fabrication. After OPC, $r_3$ is lowered to approximately 2.5 µm, hence rounded blade tip 202 is sharper after OPC than then prior to OPC.

What is claimed is:

1. A probe structure for cutting into an oxide layer of a C4 bump comprising:
   a lower base structure on top of a substrate; and
   an upper blade structure on top of the lower base structure comprising one or more blades,
      wherein (i) a crown of the C4 bump is accommodated by a cavity present in the lower base structure (ii) at least one cutting edge of the one or more blades of the upper blade structure is substantially perpendicular to the lower base structure and (iii) the upper blade structure includes a blade supporting wall with a width less than 10 µm.

2. The probe structure of claim 1 further comprising:
   the cavity present in the lower base structure is bowl-shaped.

3. The probe structure of claim 1 further comprising:
   the cavity present in the lower base structure is cylindrical in shape.

4. The probe structure of claim 1, wherein one or more cutting edges of the one or more blades point towards a center position of the probe structure.

5. The probe structure of claim 4 further comprising:
   the one or more cutting edges of the one or more blades are between 0 µm and approximately 10 µm from an edge of the cavity present in the lower base structure.

6. The probe structure of claim 1, wherein the lower base structure includes a toroid layer of conductive material.

7. The probe structure of claim 6 further comprises:
   the toroid layer of conductive material rests on top of a circular pad of conductive material.

8. The probe structure of claim 1 further comprising:
   the upper blade structure has a height of at least 35 µm.

9. The probe structure of claim 8 further comprising:
   the lower base structure is a circular pad.

\* \* \* \* \*